US011854598B2

(12) United States Patent
Carman

(10) Patent No.: US 11,854,598 B2
(45) Date of Patent: Dec. 26, 2023

(54) SELF REFRESH OF MEMORY CELL

(71) Applicant: Micron Technology, Inc., Boise, ID (US)

(72) Inventor: Eric S. Carman, San Francisco, CA (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 17/940,760

(22) Filed: Sep. 8, 2022

(65) Prior Publication Data

US 2023/0070740 A1 Mar. 9, 2023

Related U.S. Application Data

(63) Continuation of application No. 17/338,453, filed on Jun. 3, 2021, now Pat. No. 11,501,818.

(51) Int. Cl.
*G11C 11/406* (2006.01)
*G11C 11/4094* (2006.01)
*G11C 11/408* (2006.01)
*G11C 11/4074* (2006.01)

(52) U.S. Cl.
CPC .... *G11C 11/40615* (2013.01); *G11C 11/4074* (2013.01); *G11C 11/4085* (2013.01); *G11C 11/4094* (2013.01)

(58) Field of Classification Search
CPC .......... G11C 11/40615; G11C 11/4074; G11C 11/4085; G11C 11/4094
USPC ........................................ 365/222
See application file for complete search history.

(56) References Cited

U.S. PATENT DOCUMENTS

| 6,449,204 B1* | 9/2002 | Arimoto | G11C 29/028 365/194 |
|---|---|---|---|
| 2005/0052926 A1 | 3/2005 | Agata et al. | |
| 2008/0092016 A1* | 4/2008 | Pawlowski | G11C 29/52 714/E11.041 |
| 2009/0225584 A1 | 9/2009 | Rao | |

(Continued)

FOREIGN PATENT DOCUMENTS

TW 1628659 B 7/2018

OTHER PUBLICATIONS

"International Search Report and Written Opinion of the International Searching Authority," issued in connection with Int'l Appl. No. PCT/US2022/072326 dated Sep. 2, 2022 (10 pages).

(Continued)

*Primary Examiner* — Huan Hoang
(74) *Attorney, Agent, or Firm* — Holland & Hart LLP

(57) ABSTRACT

Methods, systems, and devices for self-refresh of memory cells are described. A controller coupled with a memory cell may be configured to apply a first voltage to a control gate of a first transistor, where the first voltage activates the first transistor to selectively couple terminals of the first transistor with each other based on a charge stored on the interstitial gate. The controller may be configured to apply a current to a bit line, where a second voltage of the bit line is based on the current and the charge stored on the interstitial gate. The controller may be configured to apply, based on applying the first voltage to the control gate of the first transistor and applying the current to the bit line, a third voltage to a gate of a second transistor to couple the bit line with the interstitial gate of the first transistor.

20 Claims, 9 Drawing Sheets

(56) References Cited

U.S. PATENT DOCUMENTS

| | | |
|---|---|---|
| 2009/0323424 A1 | 12/2009 | Torii |
| 2014/0355357 A1 | 12/2014 | Tailliet |
| 2015/0036437 A1 | 2/2015 | Li et al. |
| 2020/0273521 A1 | 8/2020 | Fackenthal |
| 2021/0295932 A1 | 9/2021 | Sarwar et al. |

OTHER PUBLICATIONS

Taiwanese Patent Office, "Office Action," issued in connection with Taiwanese Patent Application No. 111120558 dated Apr. 21, 2023 (11 pages).

* cited by examiner

US 11,854,598 B2

SELF REFRESH OF MEMORY CELL

CROSS REFERENCE

The present Application for Patent is a continuation of U.S. patent application Ser. No. 17/338,453 by Carman, entitled "SELF REFRESH OF MEMORY CELL," filed Jun. 3, 2021, assigned to the assignee hereof, and is expressly incorporated by reference in its entirety herein.

FIELD OF TECHNOLOGY

The following relates generally to one or more systems for memory and more specifically to self-refresh of memory cells.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
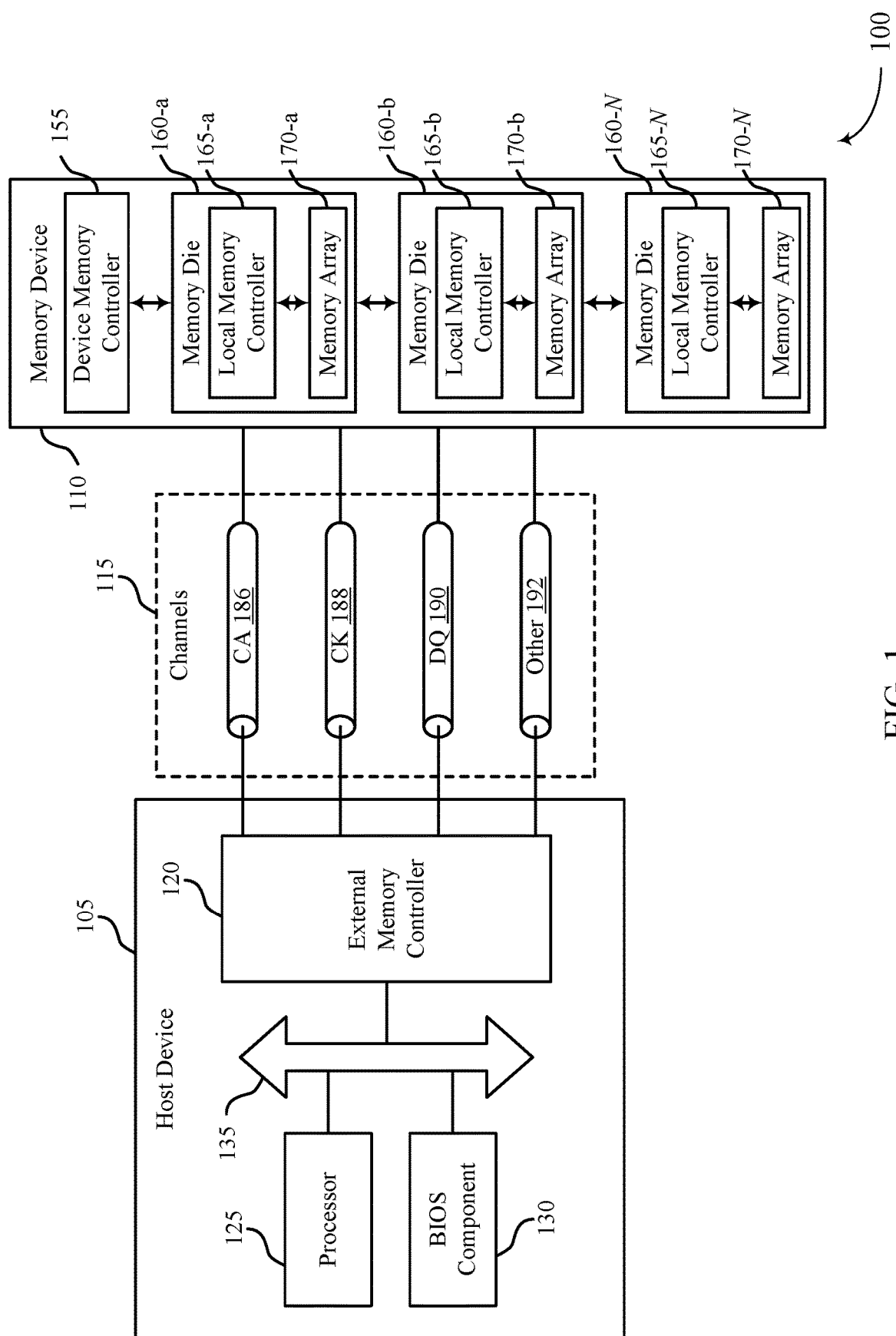
FIG. 1 illustrates an example of a system that supports self-refresh of memory cells in accordance with examples as disclosed herein.

A memory array of a memory device may include a set of memory cells. Each of the set of memory cells may include a first transistor (e.g., a p-type transistor, such as a p-channel metal-oxide-semiconductor (PMOS)) coupled with a first word line and a second transistor (e.g., an n-type transistor, such as an n-channel MOS (NMOS)) coupled with a second word line. The second transistor of each memory cell may be configured to selectively couple a respective bit line with an interstitial gate (e.g., a floating gate) of the first transistor and the first transistor may be configured to selectively couple the bit line with a ground reference of the memory array. The interstitial gate may be configured to store charge representing a state of the memory cell.

In some examples, the memory device may access a first memory cell of the set of memory cells. Accessing the first memory cell may include selecting the first word line, the second word line, and the bit line associated with the first memory cell. After accessing the first memory cell, the memory device may restore the charge stored at the first memory cell. To access and restore charge stored at each memory cell that is coupled with the first word line and the second word line, the memory device may have a sense amplifier associated with each bit line. Without a sense amplifier on a bit line to sense the charge on an unselected (e.g., for a given access operation) memory cell, selecting the first word line and the second word line may overwrite the charge stored at the unselected memory cell. Thus, to support access operations to a subset of memory cells coupled with the first word line and the second word line, the memory device may have a sense amplifier and bit line driver per bit line. However, it may be desirable to support access operations to a subset of memory cells coupled with the first word line and the second word line, without the area consumed by sense amplifiers and bit line drivers for each bit line.

The techniques described herein may enable memory cells whose bit lines are not selected for an access procedure (e.g., a read or a write) to restore charge according to a procedure which may be referred to as a self-refresh (e.g., without a dedicated sense amplifier or bit line driver for the bit line). For instance, the memory device may apply a current to a bit line of one of the other memory cells and may activate the respective first transistor to pull a voltage of the bit line down (e.g., if the charge at the interstitial gate of the respective first transistor activates the first transistor or maintains the first transistor in an on state) or may enable the current to increase the voltage on the bit line (e.g., if the charge at the interstitial gate of the respective first transistor deactivates the first transistor or maintains the first transistor in an off state). Once the voltage is developed on the bit line, the second transistor may be activated to restore sensed charge on the interstitial gate. In some examples, one or more aspects of the techniques described herein may, additionally or alternatively, be applied in examples in which a content of the memory cells is not read.

Features of the disclosure are initially described in the context of systems and dies as described with reference to FIGS. 1 and 2. Features of the disclosure are described in the context of circuits and timing diagrams as described with reference to FIGS. 3-6. These and other features of the disclosure are further illustrated by and described with reference to an apparatus diagram and flowcharts that relate to self-refresh of memory cells as described with reference to FIGS. 7-9.

FIG. 1 illustrates an example of a system 100 that supports self-refresh of memory cells in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data.

In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

A memory array 170 of a memory device 110 may include a set of memory cells. Each of the set of memory cells may include a first transistor (e.g., a p-type transistor, such as a p-channel metal-oxide-semiconductor (PMOS)) coupled with a first word line and a second transistor (e.g., an n-type transistor, such as an n-channel MOS (NMOS)) coupled with a second word line. The second transistor of each memory cell may be configured to selectively couple a respective bit line with an interstitial gate (e.g., a floating gate) of the first transistor and the first transistor may be configured to selectively couple the bit line with a ground reference of the memory array. The interstitial gate may be configured to store charge representing a state of the memory cell.

In some examples, the memory device 110 may access a first memory cell of the set of memory cells. Accessing the first memory cell may include selecting the first word line, the second word line, and the bit line associated with the first memory cell. After accessing the first memory cell, the memory device 110 may restore the charge stored at the first memory cell. To access and restore charge stored at each memory cell that is coupled with the first word line and the second word line, the memory device 110 may have a sense amplifier associated with each bit line. Without a sense amplifier on a bit line to sense the charge on an unselected (e.g., for a given access operation) memory cell, selecting the first word line and the second word line may overwrite the charge stored at the unselected memory cell. Thus, to support access operations to a subset of memory cells coupled with the first word line and the second word line, the memory device 110 may have a sense amplifier and bit line driver per bit line. However, it may be desirable to support access operations to a subset of memory cells coupled with the first word line and the second word line, without the area consumed by sense amplifiers and bit line drivers for each bit line.

The techniques described herein may enable memory cells whose bit lines are not selected for an access procedure (e.g., a read or a write) to restore charge according to a procedure which may be referred to as a self-refresh (e.g., without a dedicated sense amplifier or bit line driver for the bit line). For instance, the memory device 110 may apply a current to a bit line of one of the other memory cells and may activate the respective first transistor to pull a voltage of the bit line down (e.g., if the charge at the interstitial gate of the respective first transistor activates the first transistor or maintains the first transistor in an on state) or may enable the current to increase the voltage on the bit line (e.g., if the charge at the interstitial gate of the respective first transistor deactivates the first transistor or maintains the first transistor in an off state). Once the voltage is developed on the bit line, the second transistor may be activated to restore sensed charge on the interstitial gate. In some examples, one or more aspects of the techniques described herein may, additionally or alternatively, be applied in examples in which a content of the memory cells is not read.

Figure 2:
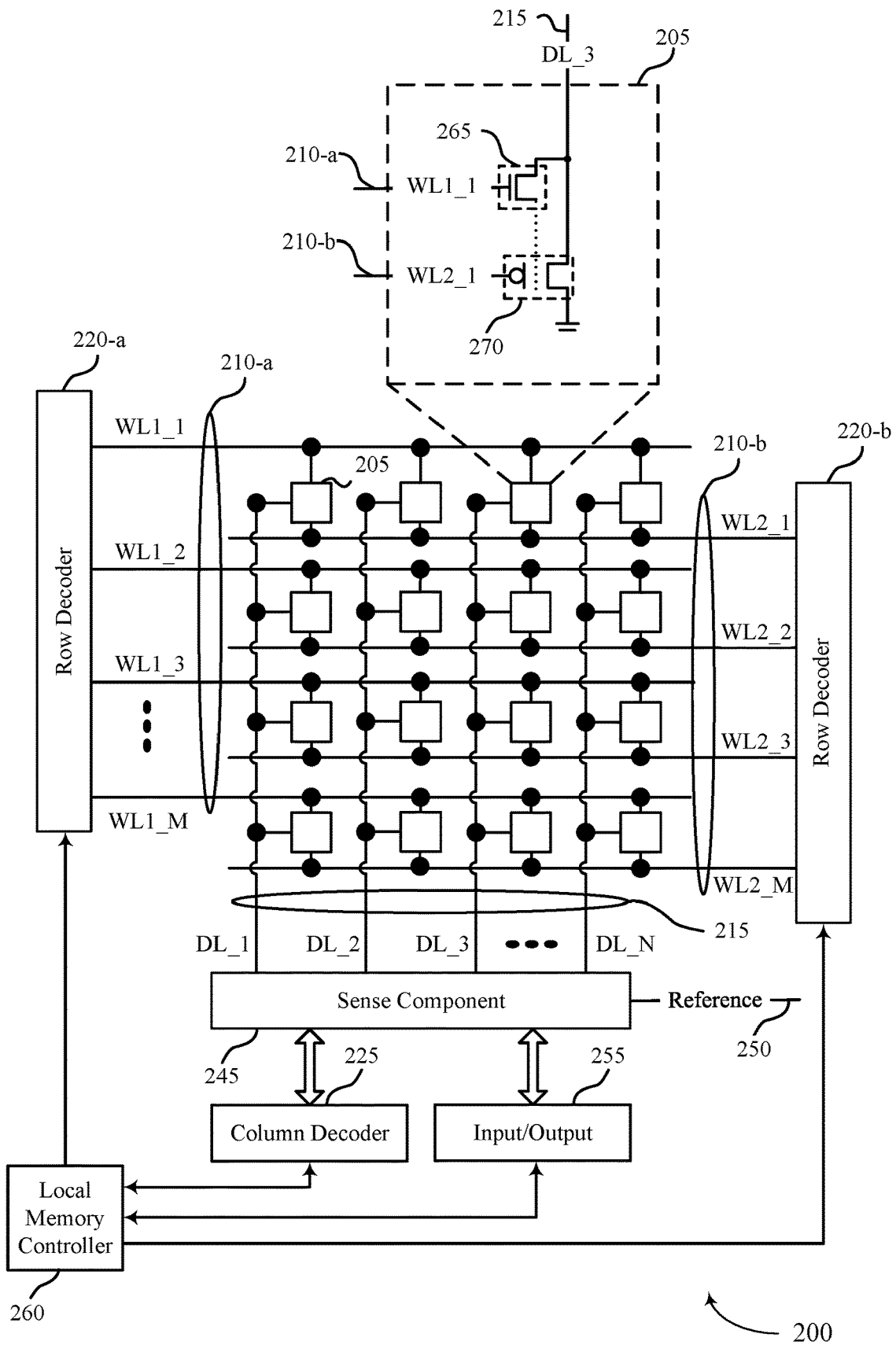
FIG. 2 illustrates an example of a memory die that supports self-refresh of memory cells in accordance with examples as disclosed herein.

FIG. 2 illustrates an example of a memory die 200 in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, or a logic 11).

The memory die 200 may include one or more access lines (e.g., one or more word lines 210-a and 210-b and one or more digit lines 215) arranged in a pattern, such as a grid-like pattern. An access line may be a conductive line coupled with a memory cell 205 and may be used to perform access operations on the memory cell 205. In some examples, word lines 210-a and 210-b may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210-a and 210-b and the digit lines 215.

A memory cell 205 may store a charge representative of the programmable states in an interstitial gate (e.g., a floating gate) of a first transistor 270. The memory cell 205 may include the first transistor 270 and a second transistor 265. In some examples the first transistor 270 and the second transistor 265 may be of different or complementary types (e.g., first transistor 270 may be a PMOS transistor, and second transistor 265 may be an NMOS transistor, or vice-versa). A first terminal (e.g., a source or drain) of first transistor 270 may be coupled with a ground reference of the memory die 200 and a second terminal (e.g., a source or drain) of the first transistor 270 may be coupled with a digit line 215. A first terminal of second transistor 265 (e.g., a source or drain) may be coupled with an interstitial gate (e.g., a floating gate) of first transistor 270 and a second terminal of second transistor 265 (e.g., a source or drain) may be coupled with the digit line 215. Additionally, a third terminal (e.g., a gate) of first transistor 270 may be coupled with a word line 210-b and a third terminal (e.g., a gate) of second transistor 265 may be coupled with a word line 210-a.

Operations such as reading and writing may be performed on the memory cells 205 by activating or selecting access lines such as one or more of a word line 210-a, a word line 210-b, or a digit line 215. By biasing a word line 210-a, 210-b, and a digit line 215 (e.g., applying a voltage to the word line 210-a, the word line 210-b, or the digit line 215), a single memory cell 205 may be accessed at their intersection. The intersection of a word line 210-a, a word line 210-b, and a digit line 215 in either a two-dimensional or three-dimensional configuration may be referred to as an address of a memory cell 205.

Accessing the memory cells 205 may be controlled through a row decoder 220-a, a row decoder 220-b, or a column decoder 225. For example, a row decoder 220-a may receive a row address from the local memory controller 260 and may activate a word line 210-a based on the received row address. Additionally, row decoder 220-b may receive the row address from the local memory controller 260 and may activate a word line 210-b based on the received row address. A column decoder 225 may receive a column address from the local memory controller 260 and may activate a digit line 215 based on the received column address.

Selecting or deselecting the memory cell 205 may be accomplished by activating or deactivating the first transistor 270 and/or the second transistor 265. For instance, the digit line 215 may be isolated from the ground reference when the first transistor 270 is deactivated and may be coupled with the ground reference when the first transistor 270 is activated. In some examples, whether the first transistor 270 activates or deactivates may be based on a state stored by the interstitial gate of the first transistor 270. For instance, if the control gate is in a first state (e.g., a high state, a state associated with a higher voltage), the first transistor 270 may remain deactivated (e.g., isolating the ground reference from the digit line 215) regardless of the charge stored at the interstitial gate of the first transistor 270. However, if the control gate is in a lower state (e.g., a lower state, a state associated with a lower voltage), the first transistor 270 may be activated depending on the charge stored at the interstitial gate. For instance, if the interstitial gate stores a first amount of charge associated with a first logic state, the first transistor 270 may be activated when the control gate is in the low state. However, if the interstitial gate of the first transistor 270 stores a second amount of charge associated with a second logic state, the first transistor may be deactivated when the control gate is in the low state. Additionally, in some examples, the interstitial gate of the first transistor 270 may be isolated from the digit line 215 when the second transistor 265 is deactivated and may be coupled with the digit line 215 when the second transistor 265 is activated.

A word line 210-a or 210-b may be a conductive line in electronic communication with a memory cell 205 that is used to perform access operations on the memory cell 205. In some architectures, the word line 210-a may be coupled with a gate of the second transistor 265 of a memory cell 205 and may be operable to control the second transistor 265 of the memory cell 205. Additionally, the word line 210-b may be coupled with a gate of the first transistor 270 of the memory cell 205 and may be operable to control the first transistor 270 of the memory cell 205.

A digit line 215 may be a conductive line that connects the memory cell 205 with a sense component 245. In some architectures, the memory cell 205 may be selectively coupled with the digit line 215 during portions of an access operation. In some architectures, the memory cell 205 may be coupled with the digit line 215.

The sense component 245 may be operable to detect a state (e.g., a charge) stored at the interstitial gate of the first transistor 270 of the memory cell 205 and to determine a logic state of the memory cell 205 based on the stored state. The sense component 245 may include one or more sense amplifiers to amplify or otherwise convert a signal resulting from accessing the memory cell 205. In some cases, the sense component 245 may compare a signal detected from the memory cell 205 to a reference 250 (e.g., a reference voltage). Alternatively, the sense component 245 may use a single-ended (e.g., non-differential) amplifier or sense circuit to amplify or latch a logic state corresponding to the memory cell 205. The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoders 220, column decoder 225, sense component 245). The local memory controller 260 may be an example of the local memory controller 165 described with reference to FIG. 1. In some examples, one or more of the row decoders 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210-a and a target digit line 215 coupled with the target memory cell 205 (e.g., the address of the target memory cell 205). The local memory controller 260 may activate the target word line 210-a and the target digit line 215 (e.g., applying a voltage to the word line 210 or digit line 215-a) to access the target memory cell 205. The local memory controller 260 may apply a specific signal (e.g., write pulse) to the digit line 215 during the write operation to store a specific state (e.g., charge) at the first transistor 270. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210-b and a target digit line 215 coupled with the target memory cell 205 (e.g., the address of the target memory cell 205). The local memory controller 260 may activate the target word line 210-b and the target digit line 215 (e.g., applying a voltage to the word line 210-b or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

In some examples, the memory die 200 may access a first memory cell 205 of the set of memory cells 205. Accessing the first memory cell 205 may include selecting the word line 210-a or the word line 210-b, and the digit line 215 associated with the first memory cell 205. After accessing the first memory cell 205, the memory die 200 may restore the charge stored at the first memory cell 205. To access and restore charge stored at each memory cell that is coupled with the word line 210-a and the word line 210-b, the memory device may have a sense amplifier associated with each digit line 215. Without a sense amplifier on a digit line to sense the charge on an unselected (e.g., for a given access operation) memory cell, selecting the word line 210-a and the word line 210-b may overwrite the charge stored at the unselected memory cell. Thus, to support access operations to a subset of memory cells coupled with the word line 210-a and the word line 210-b, the memory device may have a sense amplifier and driver per digit line. However, it may be desirable to support access operations to a subset of memory cells coupled with the word line 210-a and the word line 210-b, without the area consumed by sense amplifiers and drivers for each digit line.

The present disclosure describes techniques for refreshing the interstitial gates (e.g., floating nodes) of the first transistor 270 of the memory cell 205. For instance, the local memory controller 260 may activate the digit line 215 (e.g., apply a current to the digit line 215) and may activate word line 210-b. If the interstitial gate of first transistor 270 stores a first amount of charge, the first transistor 270 may activate and may pull a voltage of the digit line 215 down. However, if the interstitial gate of first transistor 270 stores a second amount of charge, the first transistor 270 may be deactivated or be maintained in a deactivated state, which may enable the voltage on the digit line 215 to increase or to be maintained. Once the voltage is developed on the digit line 215, the local memory controller 260 may activate word line 210-a. Activating word line 210-a may activate the second transistor 265 and may restore sensed charge at the interstitial gate of first transistor 270. In some examples, a subset of memory cells, having fewer or up to all memory cells of a row may be refreshed simultaneously. Additionally, the techniques described herein may be used when the memory die 200 is to execute an activate command (e.g., page open), a read command, or a write command.

In some examples, by performing the methods as described herein, the sense component 245 may include a quantity of sense amplifiers for each row equal to a quantity of selected memory cells 205 on that row. For instance, if each row has N memory cells 205 and digit lines 215 and an interface to the memory device has a width or burst size of M the sense component 245 may include M sense amplifiers which may be selectively coupled with M digit lines of the N digit lines. Accordingly, instead of having, for instance, one sense amplifier per digit line 215, the sense component 245 may have one sense amplifier per a set of digit lines 215 (e.g., per a set of N/M digit lines 215). That is, the sense amplifiers may be used to perform an access operation on M memory cells 205 of the N memory cells 205 in a row, while N-M memory cells 205 of the row perform a self-refresh operation without being coupled to sense amplifiers. Having fewer sense amplifiers may reduce a power of the memory die 200, which may increase the efficiency of the memory die 200 and/or may increase a battery life of the memory die 200. Additionally, reducing the quantity of sense amplifier may reduce a quantity of control signals used to perform access operations.

Figure 3:
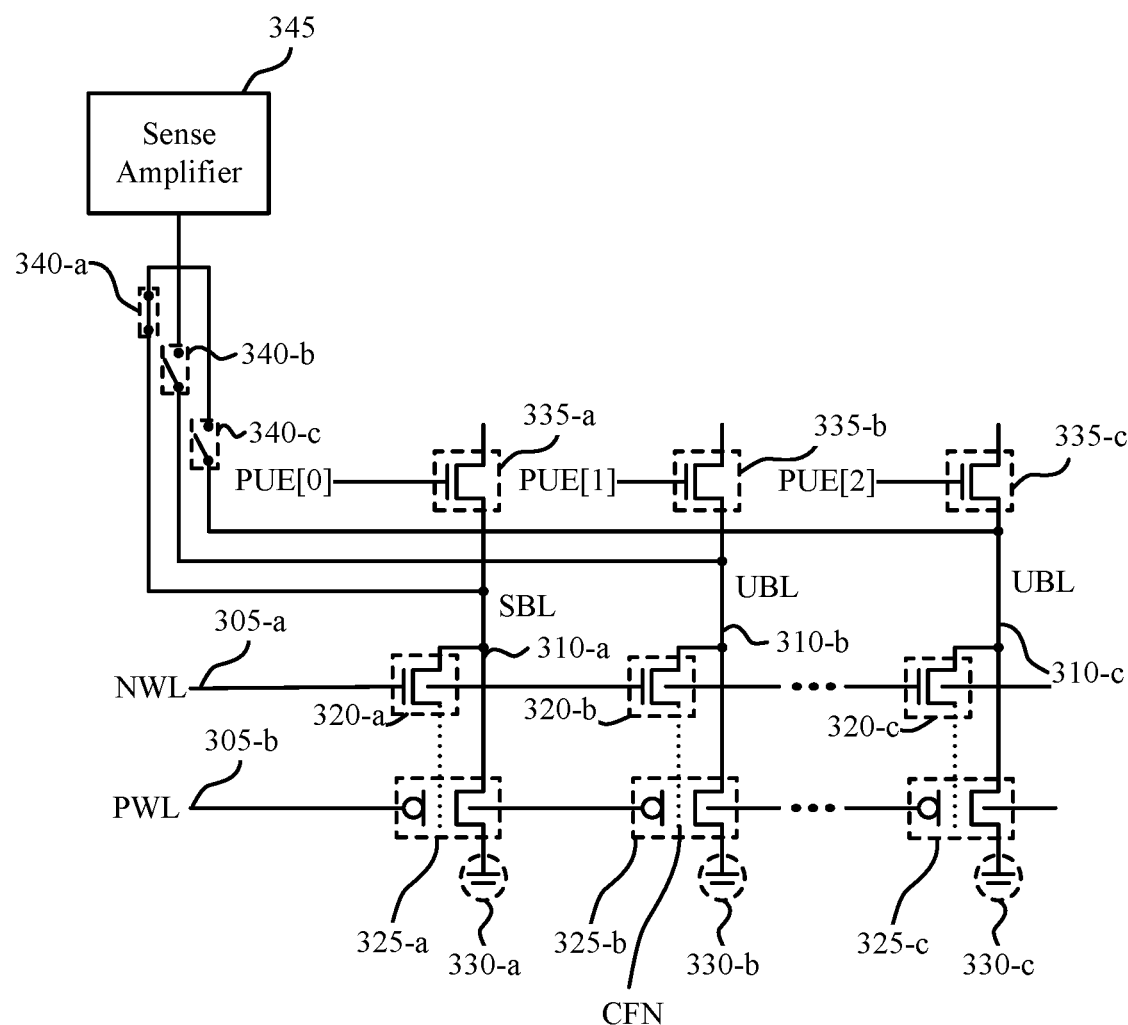
FIG. 3 illustrates an example of a circuit that supports self-refresh of memory cells in accordance with examples as disclosed herein.

FIG. 3 illustrates an example of a circuit 300 that supports self-refresh of memory cells in accordance with examples as disclosed herein. In some examples, circuit 300 may implement one or more features of memory die 200. For instance, word line 305-*a* may be an example of a word line 210-*a* as described with reference to FIG. 2; word line 305-*b* may be an example of a word line 210-*b* as described with reference to FIG. 2; digit lines 310-*a*, 310-*b*, and 310-*c* may be examples of digit lines 215 as described with reference to FIG. 2; second transistors 320-*a*, 320-*b*, and 320-*c* may be examples of second transistors 265 as described with reference to FIG. 2; and first transistors 325-*a*, 325-*b*, and 325-*c* may be examples of first transistors 270 as described with reference to FIG. 2. In some examples, second transistor 320-*a* and first transistor 325-*a* may correspond to a first memory cell of a row of a memory array, second transistor 320-*b* and first transistor 325-*b* may correspond to a second memory cell of the row of the memory array, and second transistor 320-*c* and first transistor 325-*c* may correspond to a third memory cell of the row of the memory array. In some examples, digit lines may also be referred to as bit lines.

Word line 305-*a* may be coupled with a gate of second transistor 320-*a*, a gate of second transistor 320-*b*, and a gate of second transistor 320-*c*. Word line 305-*b* may be coupled with a gate of first transistor 325-*a*, a gate of first transistor 325-*b*, and a gate of first transistor 325-*c*. The gates of first transistors 325 coupled to word line 305-*b* may also be called control gates, and activation of the control gates may enable the interstitial gates to control the activation or deactivation of first transistors 325. A first terminal (e.g., a source or drain) of first transistor 325-*a* may be coupled with a ground reference 330-*a*; a first terminal (e.g., a source or drain) of first transistor 325-*b* may be coupled with a ground reference 330-*b*; and a first terminal (e.g., a source or drain) of first transistor 325-*c* may be coupled with a ground reference 330-*c*. In some examples, ground references 330-*a*, 330-*b*, and 330-*c* may correspond to a same ground reference. A first terminal (e.g., a source or drain) of second transistor 320-*a* may be coupled with an interstitial gate of first transistor 325-*a*; a first terminal (e.g., a source or drain) of second transistor 320-*b* may be coupled with an interstitial gate of first transistor 325-*b*; and a first terminal (e.g., a source or drain) of second transistor 320-*c* may be coupled with an interstitial gate of first transistor 325-*c*. A second terminal (e.g., the other of the source or the drain) of first transistor 325-*a* and a second terminal (e.g., the other of the source or the drain) of second transistor 320-*a* may be coupled with digit line 310-*a*; a second terminal (e.g., the other of the source or the drain) of first transistor 325-*b* and a second terminal (e.g., the other of the source or the drain) of second transistor 320-*b* may be coupled with digit line 310-*b*; and a second terminal (e.g., the other of the source or the drain) of first transistor 325-*c* and a second terminal (e.g., the other of the source or the drain) of second transistor 320-*c* may be coupled with digit line 310-*c*.

Digit line 310-*a* may be coupled with third transistor 335-*a*, digit line 310-*b* may be coupled with third transistor 335-*b*, and digit line 310-*c* may be coupled with third transistor 335-*c*. Additionally, digit line 310-*a* may be coupled with switching component 340-*a*, digit line 310-*b* may be coupled with switching component 340-*b*, and digit line 310-*c* may be coupled with switching component 340-*c*.

Each of switching components 340-*a*, 340-*b*, and 340-*c* may be coupled with a sense amplifier 345. In some examples, each of switching component 340-*a*, 340-*b*, and 340-*c* may be an example of a fourth transistor. In some such examples, a first terminal (e.g., one of a source or a drain) of each fourth transistor may be coupled with a respective digit line and a second terminal (e.g., the other of the source or the drain) may be coupled with the sense amplifier 345.

First transistor 325-*a* may be configured to selectively couple digit line 310-*a* with ground reference 330-*a*; first transistor 325-*b* may be configured to selectively couple digit line 310-*b* with ground reference 330-*b*; and first transistor 325-*c* may be configured to selectively couple digit line 310-*c* with ground reference 330-*c*. Second transistor 320-*a* may be configured to selectively couple digit line 310-*a* with the interstitial gate of first transistor 325-*a*; second transistor 320-*b* may be configured to selectively couple digit line 310-*b* with the interstitial gate of first transistor 325-*b*; and second transistor 320-*c* may be configured to selectively couple digit line 310-*c* with the interstitial gate of first transistor 325-*c*. Third transistor 335-*a* may be configured to selectively couple digit line 310-*a* with a current source; third transistor 335-*b* may be configured to selectively couple digit line 310-*b* with the current source; and third transistor 335-*c* may be configured to selectively couple digit line 310-*c* with the current source (e.g., via pull up enable (PUE) signals PUE[0], PUE[1], or PUE[2]). Alternatively, third transistors 335 may operate as current sources, where a reference voltage on the gate of third transistors 335 (e.g., PUE[0], PUE[1], or PUE[2]) may set a current sourced by third transistors 335. In some instances, third transistors 335 may be PMOS transistors. Switching component 340-*a* may be configured to selectively couple digit line 310-*a* with sense amplifier 345; switching component 340-*b* may be configured to selectively couple digit line 310-*b* with sense amplifier 345; and switching component 340-*c* may be configured to selectively couple digit line 310-*c* with sense amplifier 345.

In some examples, a self-refresh (e.g., self-restore) operation may be performed at one or more of the memory cells (e.g., without performing an access operation through a sense amplifier). For instance, digit line 310-*b* may be charged high and then may be discharged via first transistor 325-*b*. The discharge of digit line 310-*b* may depend on a voltage of the interstitial gate of first transistor 325-*b* and a discharge time. After discharging digit line 310-*b*, second transistor 320-*b* may be activated and may charge the interstitial gate of first transistor 325-*b* to the voltage of digit line 310-*b*. In examples in which the charge at the interstitial gate is such that first transistor 325-*b* is activated, the interstitial gate may draw current from digit line 310-*b* at least until the current between the source and drain of first transistor 325-*b* matches a current provided to digit line 310-*b* via third transistor 335-*b* (e.g., which may act as a current source). For instance, the voltage of the interstitial gate of first transistor 325-*b* may modify an equilibrium voltage of digit line 310-*b* to balance currents. In some such examples, the second transistor 320-*b* may be deactivated and, accordingly, the interstitial gate of first transistor 325-*b* may remain set by a previous access operation. Although some transient effects (e.g., digit line coupling from activating word lines 305) may occur, these effects may cancel out. In some examples, the current between a source and drain of third transistor 335-*b* may be represented as $$I_{pull\_up} = \frac{1}{2}\mu_p C_{ox}\frac{W}{L}(V_{SG} - |V_T|)^2(1 + \lambda V_{SD})$$

and a current between the first and the second terminals of first transistor 325 may be $$I_{pmos} = \frac{1}{2}\mu_p C_{ox}\frac{W}{L}(V_{SG} + V_{fg} - |V_T|)^2(1 + \lambda V_{SD})$$

where $V_{fg}$ may be a voltage of the interstitial gate. In some examples, $I_{pull\_up}=I_{pmos}$. In examples where second transistor 320 is deactivated, $V_{fg}$ may not charge but may act to balance currents. Accordingly, transient effects such as digit line or bit line coupling may cancel out.

Figure 4:
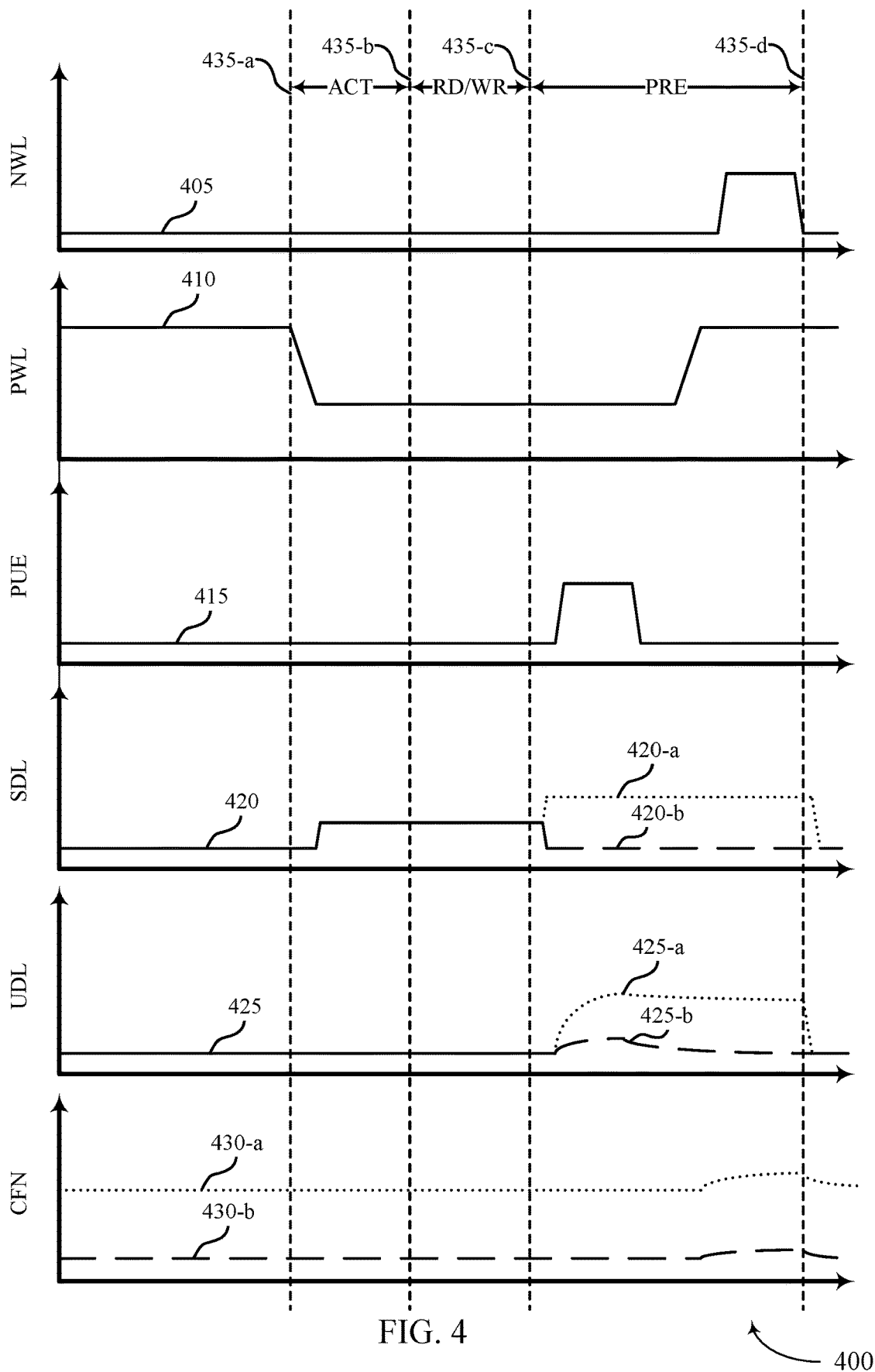
FIG. 4 illustrates an example of a timing diagram that supports self-refresh of memory cells in accordance with examples as disclosed herein.

FIG. 4 illustrates an example of a timing diagram 400 that supports self-refresh of memory cells in accordance with examples as disclosed herein. For instance, timing diagram 400 may be an example of signaling that supports a self-refresh operation at memory cells of circuit 300.

Word line signaling 405 (NMOS word line (NWL)) may correspond to a voltage on word line 305-*a* and word line signaling 410 (PMOS word line (PWL)) may correspond to a voltage on word line 305-*b*. Pull-up enable (PUE) signaling 415 may correspond to a voltage at a gate of a third transistor 335 (e.g., one or more of third transistors 335-*a*, 335-*b*, and 335-*c*), or to an enable circuit for enabling third transistor 335 to supply a current. Selected digit line (SDL) signaling 420 may correspond to a voltage on a digit line 310 selected during an access operation (e.g., a read or a write operation). For example, the access operation may be a read operation and selected digit line signaling 420-*a* may correspond to the voltage on the selected digit line 310 when an interstitial gate of a respective first transistor 325 stores a first state (e.g., a logical '1') and selected digit line signaling 420-*b* may correspond to a voltage on the selected digit line 310 when the interstitial gate of the respective first transistor 325 stores a second state (e.g., a logical '0'). Unselected digit line (UDL) signaling 425 may correspond to a voltage on a digit line 310 that is not selected during the access operation. Unselected digit line signaling 425-*a* may correspond to the voltage on the unselected digit line 310 when an interstitial gate of a respective first transistor 325 stores the first state and unselected digit line signaling 425-*b* may correspond to a voltage on the unselected digit line 310 when the interstitial gate of the respective first transistor 325 stores the second state. Cell floating node (CFN) signaling 430-*a* and 430-*b* may each correspond to a voltage at the interstitial gate of a first transistor 325. For instance, cell floating node signaling 430-*a* may correspond to a voltage at the interstitial gate of the first transistor 325 when the interstitial gate stores the first state and cell floating node signaling 430-*b* may correspond to a voltage at the interstitial gate of first transistor 325 when the interstitial gate stores the second state.

Between 435-*a* and 435-*d*, circuit 300 may perform an access operation. Performing the access operation may include circuit 300 performing an activate operation (e.g., between 435-*a* and 435-*b*), a read or write operation (e.g., between 435-*b* and 435-*c*) and a pre-charge operation (between 435-*c* and 435-*d*).

At 435-*a*, word line signaling 410 may transition from a high voltage to a low voltage (e.g., from an idle voltage to a read voltage). Transitioning from the high voltage to the low voltage may activate (e.g., turn on) each first transistor 325 coupled with word line 305-*b* (e.g., first transistors 325-*a*, 325-*b*, and 325-*c*). At or after 435-*a* (e.g., and before 435-*b*), selected digit line signaling 420 may transition from a low voltage to a high voltage (e.g., may transition to a read voltage). For instance, if digit line 310-*a* is the selected digit line, the voltage on digit line 310-*a* may transition from the low voltage to a higher or intermediate voltage. The change in selected digit line signaling 420 between 435-*a* and 435-*b* may be sensed by sense amplifier 345 and a result may be stored as a logical 0 or 1 in sense amplifier 345. Sensing the charge may include coupling sense amplifier 345 with digit line 310-*a* via switching component 340-*a*. At a same time that switching component 340-*a* is configured to couple sense amplifier 345 and digit line 310-*a*, switching component 340-*b* may be configured to isolate digit line 310-*b* from sense amplifier 345 and switching component 340-*c* may be configured to isolate digit line 310-*c* from sense amplifier 345.

Between 435-*b* and 435-*c*, circuit 300 may determine to perform a read or write on data stored in sense amplifier 345 that is coupled to the selected digit line. For instance, if the command is a read operation, circuit 300 and/or local memory controller 260 may read the data stored in sense amplifier 345 during the sense operation and may output data (e.g., using an input/output, such as an input/output 255 as described herein, for instance, with reference to FIG. 2). If the command is a write operation, circuit 300 and/or local memory controller 260 may write a logical 0 to a sense amplifier 345 in place of a logical 0 or 1 that was stored during the sense operation. Alternatively, during a write operation, circuit 300 and/or local memory controller 260 may write a logical 1 to sense amplifier 345 in place of a logical 0 or 1 that was previously stored during the sense operation.

At or after 435-*c* (e.g., during a precharge operation), pull-up enable signaling 415 may transition from a low voltage to a high voltage. Pull-up enable signaling 415 transitioning to the high voltage may activate the third transistors 335 of the unselected digit lines 310 (e.g., digit lines 310-*b* and 310-*c*). Additionally, in some examples, pull-up enable signaling 415 may also activate the third transistor 335 of the selected digit line 310 (e.g., digit line 310-*a*). Activating the one or more third transistors 335 may enable current to be applied to the respective digit lines 310 coupled with each of the one or more third transistors 335.

Timing diagram 400 may illustrate a read operation on the first memory cell including first transistor 325-*a* and second transistor 320-*a*. At or after 435-*a*, sense amplifier 345 may detect the state of the interstitial gate of first transistor 325-*a*. If the interstitial gate of the first transistor 325-*a* stores a first state, the sense amplifier 345 may detect the first state and may transition the selected digit line 310 to a higher voltage according to selected digit line signaling 420-*a*. However, if the interstitial gate of the first transistor 325-*a* stores a second state, the sense amplifier 345 may detect the second state and may transition the selected digit line 310 to a lower voltage according to selected digit line signaling 420-*b*. Additionally, at or after 435-*c*, if the first transistor 325 of a an unselected digit line 310 (e.g., the interstitial gate of first transistor 325-*b* or first transistor 325-*c*) stores the first state, that unselected digit line 310 may transition to a higher voltage as illustrated by unselected digit line signaling 425-*a* because a current may be supplied via the third transistor 335 and the first transistor may be deactivated, allowing the deselected digit line 310 to charge to a higher voltage. However, if the interstitial gate of the first transistor 325 of the unselected digit line 310 stores the second state, the unselected digit line 310 may remain at or transition to a lower voltage because the first transistor 325 may sink the current supplied via the third transistor to the ground reference 330, thus preventing the digit line 310 to charge as illustrated by unselected digit line signaling 425-*b*.

After the voltage on the selected and unselected digit lines 310 transition according to the applied current and the state stored at interstitial gates of respective first transistors 325, pull-up enable signaling 415 may transition from the high voltage to the low voltage. Pull-up enable signaling 415 transitioning to the low voltage may deactivate the third transistors 335 previously activated by pull-up enable signaling transitioning to the high voltage. In some examples, first transistors 325 that store the first state may have a higher floating gate voltage and may thus sink less read current from their digit lines 310 than first transistors 325 storing the second state.

After pull-up enable signaling 415 transitions back to the low voltage, word line signaling 410 may transition back from the low voltage to the high voltage. Transitioning to the high voltage may deactivate the first transistors 325 coupled with word line 305-*b* (e.g., first transistors 325-*a*, 325-*b*, and 325-*c*. Additionally, after pull-up enable signaling transitions back to the low voltage, word line signaling 405 may transition from a low voltage to a high voltage. Transitioning from the low voltage to the high voltage may activate (e.g., turn on) each second transistor 320 coupled with word line 305-*a* (e.g., second transistors 320-*a*, 320-*b*, and 320-*c*). Activating the second transistors 320 may enable interstitial gates of respective first transistors 325 to be charged by respective digit lines 310. For instance, if an interstitial gate of a first transistor 325 stores the first state, the charge stored at the interstitial gate may be restored according to cell floating node signaling 430-*a*. However, if the interstitial gate of the first transistor 325 stores the second state, the charge stored at the interstitial gate may be restored according to cell floating node signaling 430-*b*.

In some examples, pull-up enable signaling 415 may not transition back to the low voltage until after word line signaling 405 transitions from the low voltage to the high voltage and back to the low voltage. In such examples, pull-up enable signaling 415 may transition from the high voltage to the low voltage after word line signaling 405 transitions back to the low voltage. Additionally or alternatively, word line signaling 410 may not transition back to the high voltage until after word line signaling 405 transitions from the low voltage to the high voltage and back to the low voltage. In such examples, word line signaling 410 may transition from the low voltage to the high voltage after word line signaling transitions back to the low voltage. Refraining from transitioning pull-up enable signaling 415 back to the low voltage and/or refraining from transitioning word line signaling 410 back to the high voltage until after word line signaling 405 transitions back to the low voltage may enable a digit line 310 associated with the signaling to be actively driven while a second transistor 320 coupled with the digit line 310 is activated (e.g., as opposed to enabling digit line 310 to be floating while second transistor 320 is activated).

After the charge has been restored at the interstitial gates of respective first transistors 325, word line signaling 405 may transition from the high voltage to the low voltage. Transitioning from the high voltage to the low voltage may deactivate each of the second transistors 320 coupled with word line 305-*a* (e.g., second transistors 320-*a*, 320-*b*, and 320-*c*), thus trapping the charge on the interstitial gates of the first transistors 325 that was transferred or supplied during word line signaling 405 when at the high voltage.

At or after 435-*d*, if the interstitial gate of the first transistor 325 of the selected digit line 310 stores the first state, selected digit line signaling 420-*a* may transition to the low voltage (e.g., the voltage of selected digit line signaling 420 prior to or at 435-*a*). Additionally, at or after 435-*d*, if the interstitial gates of first transistors 325 of unselected digit lines 310 stores the first state, unselected digit line signaling 425-*a* may transition to the low voltage (e.g., the voltage of unselected digit line signaling 425 prior to or at 435-*a*).

In some examples, circuit 300 may perform the methods described herein without performing an access operation for a memory cell using a sense amplifier. For instance, during the time duration between 435-*b* and 435-*c*, the circuit 300 may refrain from performing an access operation on an unselected cell. Alternatively, 435-*b* and 435-*c* may occur at a same time (e.g., the duration between 435-*b* and 435-*c* may be equal to 0). In some examples in which an access operation is not performed, SDL signaling 420 may not represent one or more (or any of) digit lines 310 (digit lines 310-*a*, 310-*b*, and/or 310-*c*) and/or UDL signaling 425 may represent one or more (or all of) digit lines 310 (e.g., digit lines 310-*a*, 310-*b*, and/or 310-*c*). That is, an access operation may be performed on a first subset of memory cells of a row of memory cells while a self-refresh operation may be performed on a second subset of memory cells of the row of memory cells. Alternatively, a self-refresh operation (e.g., without an access operation being performed or sense amplifiers being used to read or write any memory cells of the row) may be performed on all memory cells of a row of memory cells.

In some examples, restoring charge at interstitial gates as described herein may have one or more advantages. For instance, the method of restoring charge at interstitial gates of first transistors 325 of unselected digit lines 310 as described herein may not include coupling the unselected digit lines 310 with a sense amplifier 345. Other methods may include using a sense amplifier 345 for each digit line 310. Accordingly, the methods described herein may enable the circuit 300 to include a fewer quantity of sense amplifiers 345 (e.g., one sense amplifier 345 for a group of digit lines) as compared to other methods (e.g., circuit 300 may have fewer sense amplifiers 345 than digit lines 310). Additionally or alternatively, the methods described herein may enable unselected digit lines 310 within a page to restore charge at an interstitial gate of a first transistor 325 during an access operation. Accordingly, the methods described herein may prevent interstitial gates from losing or lengthen the amount of time it takes for interstitial gates to lose charge beyond a threshold amount. For example, the self-refresh operation may be performed on all memory cells of a row during a refresh operation. Additionally, the methods described herein may enable DRAM memory cells, which may not be capable of performing a self-restore or self-refresh, to be replaced with other types of memory cells (e.g., memory cells 205 as described with reference to FIG. 2), which may be capable of performing a self-restore or self-refresh.

Figure 5:
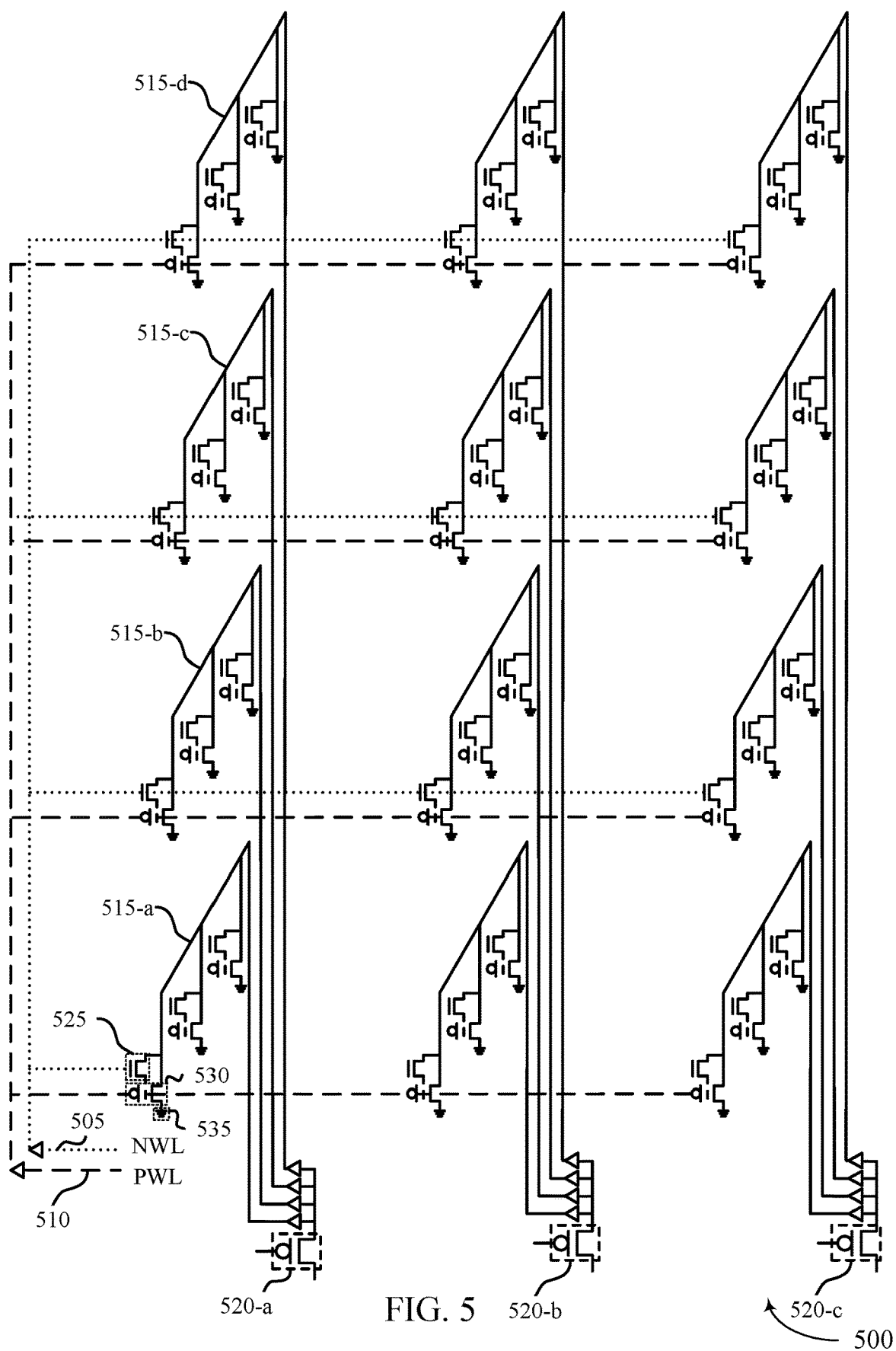
FIG. 5 illustrates an example of a circuit that supports self-refresh of memory cells in accordance with examples as disclosed herein.

FIG. 5 illustrates an example of a circuit 500 that supports self-refresh of memory cells in accordance with examples as disclosed herein. In some examples, circuit 500 may be implemented by one or more aspects of circuit 300. For instance, word line 505 may be an example of a word line 305-*a* as described with reference to FIG. 3; word line 510 may be an example of a word line 305-*b* as described with reference to FIG. 3; digit lines 515-*a*, 515-*b*, 515-*c*, and 515-*d* may be examples of digit lines 310 as described with reference to FIG. 3; first transistor 530 may be an example of a first transistor 325 as described with reference to FIG. 3; second transistor 525 may be an example of a second transistor 320 as described with reference to FIG. 3; ground reference 535 may be an example of a ground reference 330 as described with reference to FIG. 3; third transistors 520-a, 520-b, and 520-c may be examples of third transistors 335 as described with reference to FIG. 3; or any combination thereof. In some examples, circuit 500 may be an example of a multi-deck memory array.

Circuit 500 may include multiple decks of memory arrays. For instance, digit line 515-a may be coupled with memory cells of a first deck; digit line 515-b may be coupled with memory cells of a second deck; digit line 515-c may be coupled with memory cells of a third deck; and digit line 515-d may be coupled with memory cells of a fourth deck. Each memory cell may include a respective first transistor 530, a respective second transistor 525, and a respective ground reference 535. Word line 505 may be coupled with a gate of one first transistor 530 of each of digit lines 515-a, 515-b, 515-c, and 515-d. Additionally, word line 510 may be coupled with a gate of one second transistor 525 of each of digit lines 515-a, 515-b, 515-c, and 515-d.

A first terminal (e.g., one of a source or a drain) of each respective first transistor 530 may be coupled with a respective ground reference 535 and a second terminal (e.g., the other of the source or the drain) may be coupled with a respective digit line 515. A first terminal (e.g., one of a source or a drain) of each respective second transistor 525 may be coupled with an interstitial gate of a respective first transistor 530 and a second terminal (e.g., the other of the source or the drain) may be coupled with the respective digit line 515. Each digit line 515 may be coupled with a third transistor 520. For instance, in the present example, digit lines 515-a, 515-b, 515-c, and 515-d may be coupled with third transistor 520-a. In some examples, a multiplexer may be present between the digit lines 515-a, 515-b, 515-c, and 515-d and third transistor 520-a.

Each first transistor 530 may be configured to selectively couple a respective ground reference 535 with a respective digit line 515. Additionally, each first transistor 530 may be configured to store a state of the memory cell that includes the first transistor 530 at the interstitial gate of the first transistor 530. Each second transistor 525 may be configured to selectively couple an interstitial gate of a respective first transistor 530 with a respective digit line 515. Each third transistor 520 may be a current source or may be configured to couple one or more digit lines 515 (e.g., digit lines 515-a, 515-b, 515-c, and 515-d) with a current source (e.g., a DC current source). If present, each multiplexer between a third transistor 520 and a respective set of digit lines 515 may be configured to selectively couple the third transistor 520 with one of the respective set of digit lines 515 and to isolate the remaining digit lines 515 of the set of digit lines 515 from the third transistor 520.

In some examples, having word lines 505 and 510 that are coupled with memory cells of multiple decks may have one or more advantages. For instance, a fewer quantity of word line drivers may be used for the word lines 505 and 510 as compared to having separate word line 505 and 510 for each deck and socket wiring may be performed in a less complex manner. Driving a word line 505 and/or 510 for multiple decks may enable memory cell coupled with the word line 505 and/or 510 to be written back together. Methods that do not utilize a self-restore as described herein may include a sense amplifier per digit line per deck. However, methods as described herein that do utilize a self-restore may use fewer sense amplifiers. In some examples, a self-restore as described herein may be used to refresh unselected bits on a selected word line 505 and/or 510 of a selected deck. Additionally or alternatively, with word lines 505 and 510 being shared between decks, bits on unselected decks may be refreshed during an access operation on a selected deck. In some such examples, circuit 500 may employ a digit line deck select.

Figure 6:
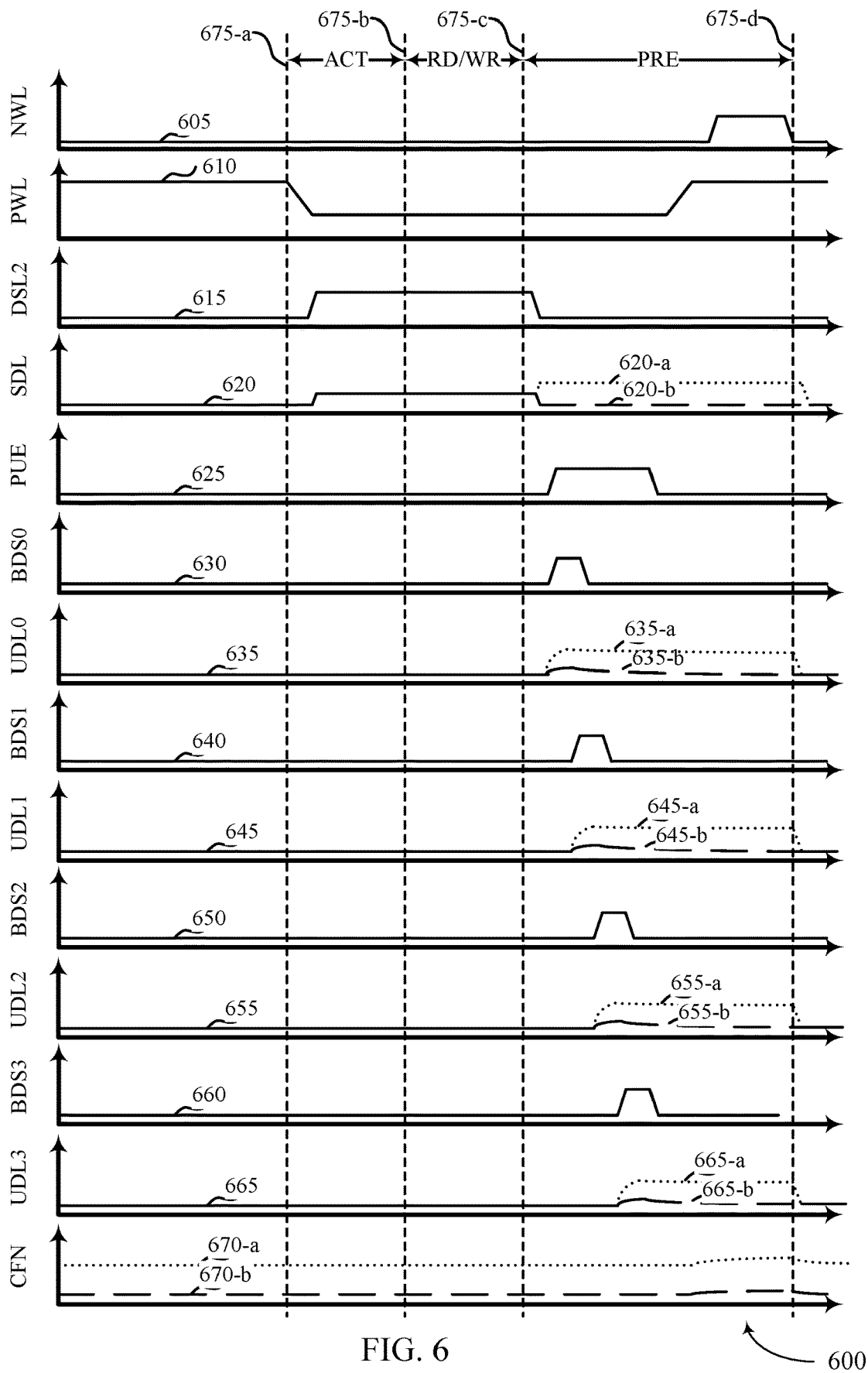
FIG. 6 illustrates an example of a timing diagram that supports self-refresh of memory cells in accordance with examples as disclosed herein.

FIG. 6 illustrates an example of a timing diagram 600 that supports self-refresh of memory cells in accordance with examples as disclosed herein. For instance, timing diagram 600 may be an example of signaling that supports a self-refresh operation at memory cells of circuit 500.

Word line (NMOS word line (NWL)) signaling 605 may correspond to a voltage on word line 505 and word line signaling 610 (PMOS word line (PWL) signaling) may correspond to a voltage on word line 510. Third deck select signaling 615 (deck select two (DSL2)) may correspond to a voltage associated with a selected deck and selected digit line signaling 620 (selected digit line (SDL)) may correspond to a voltage on a digit line 515 of the selected deck (e.g., for a read operation). Selected digit line signaling 620-a may correspond to the voltage on the selected digit line 515 when the interstitial gate of a respective first transistor 530 stores a first state and selected digit line signaling 620-b may correspond to the voltage on the selected digit line 515 when the interstitial gate of the respective first transistor 530 stores the second state. Pull-up enable signaling 625 (pull-up enable (PUE)) may correspond to a voltage at a gate of a third transistor 520 (e.g., third transistors 520-a, 520-b, and/or 520-c) or may correspond to an enable circuit for enabling one or more third transistors 520 to supply a current.

First deck select signaling 630 (bit line deck select zero (BDS0)) corresponds to a voltage associated with the first deck (e.g., a voltage that when high enables the current source coupled with a third transistor 520 to be coupled with digit lines 515 of the first deck) and unselected digit line signaling 635 (unselected digit line zero (UDL0)) may correspond to a voltage on an unselected digit line 515 of the first deck (e.g., digit line 515-a). Second deck select signaling 640 (bit line deck select one (BDS1)) corresponds to a voltage associated with the second deck (e.g., a voltage that when high enables the current source coupled with a third transistor 520 to be coupled with digit lines 515 of the second deck) and unselected digit line signaling 645 (unselected digit line one (UDL1)) may correspond to a voltage on an unselected digit line 515 of the second deck (e.g., digit line 515-b). Third deck select signaling 650 (bit line deck select two (BDS2)) corresponds to a voltage associated with the third deck (e.g., a voltage that when high enables the current source coupled with a third transistor 520 to be coupled with digit lines 515 of the third deck) and unselected digit line signaling 655 (unselected digit line two (UDL2)) may correspond to a voltage on an unselected digit line 515 of the third deck (e.g., digit line 515-c). Fourth deck select signaling 660 (bit line deck select three (BDS3)) corresponds to a voltage associated with the fourth deck (e.g., a voltage that when high enables the current source coupled with a third transistor 520 to be coupled with digit lines 515 of the fourth deck) and unselected digit line signaling 665 (unselected digit line three (UDL3)) may correspond to a voltage on an unselected digit line 515 of the fourth deck (e.g., digit line 515-d). Each of unselected digit line signaling 635-a, 645-a, 655-a, and 665-a may correspond to a voltage on a respective unselected digit line 515 when an interstitial gate of a respective first transistor 530 stores a first state and each of unselected digit line signaling 635-*b*, 645-*b*, 655-*b*, and 665-*b* may correspond to the voltage on the respective unselected digit line 515 when the interstitial gate of the respective first transistor 530 stores a second state.

Cell floating node signaling 670-*a* and 670-*b* (cell floating node (CFN)) may each correspond to a voltage at the interstitial gate of a first transistor 530. For instance, cell floating node signaling 670-*a* may correspond to a voltage at the interstitial gate of the first transistor 530 when the interstitial gate stores the first state and cell floating node signaling 670-*b* may correspond to a voltage at the interstitial gate of the first transistor 530 when the interstitial gate stores the second state.

Between 675-*a* and 675-*d*, circuit 500 may perform an access operation. Performing the access operation may include circuit 500 performing an activate operation (e.g., between 675-*a* and 675-*b*), a read or write operation (e.g., between 675-*b* and 675-*c*) and a pre-charge operation (between 675-*c* and 675-*d*).

At 675-*a*, word line signaling 610 may transition from a high voltage to a low voltage (e.g., from an idle voltage to a read voltage). Transitioning from the high voltage to the low voltage may activate (e.g., turn on) each first transistor 530 coupled with word line 510. At or after 675-*a* (e.g., and before 675-*b*), selected digit line signaling 620 may transition from a low voltage to a high voltage (e.g., may transition to a read voltage). For instance, if digit line 515-*c* is the selected digit line, the voltage on digit line 515-*c* may transition from the low voltage to a higher voltage or an intermediate voltage. Additionally, at or after 675-*a* (e.g., substantially simultaneously with selected digit line signaling 620 transitioning to the high voltage), third deck select signaling 615 may transition from a low voltage to a high voltage.

Between 675-*b* and 675-*c*, circuit 500 and/or local memory controller 260 may determine to perform a read or write on a sense amplifier (e.g., a sense amplifier 345 as described with reference to FIG. 3) coupled to the selected digit line. For instance, if the command is a write operation, circuit 500 and/or local memory controller 260 may write data to a sense amplifier (e.g., a sense amplifier 345 as described with reference to FIG. 3). At or after 675-*c*, the sense amplifier may write a charge to the interstitial gate of a first transistor 530 of the selected digit line 515.

At or after 675-*c*, pull-up enable signaling 625 may transition from a low voltage to a high voltage. Pull-up enable signaling 625 transitioning to the high voltage may activate one or more of the third transistors 520-*a*, 520-*b*, and 520-*c*. Activating the one or more third transistors 520 may enable current to be applied to the respective digit lines 515 coupled with each of the one or more third transistors 520. At or after 675-*c*, third deck select signaling 615 may transition from a high voltage to a low voltage.

Timing diagram 600 may illustrate a read operation on a memory cell including a respective first transistor 530 and a respective second transistor 525. At or after 675-*a*, a sense amplifier coupled with the memory cell may detect the state of the interstitial gate of the respective first transistor 530. If the interstitial gate of the respective first transistor 530 stores a first state, the sense amplifier may detect the first state and may transition the selected digit line 515 to a higher voltage according to selected digit line signaling 620-*a*. However, if the interstitial gate of the respective first transistor 530 stores a second state, the sense amplifier may detect the second state and may transition the selected digit line 310 to a lower voltage according to selected digit line signaling 620-*b*.

Additionally, at or after 675-*c*, first deck select signaling 630 may transition from a low voltage to a high voltage. Additionally, at or after 675-*c*, if the interstitial gate of first transistor 530 of a an unselected digit line 515 of the first deck (e.g., digit line 515-*a*) stores the first state, that unselected digit line 515 may transition to a higher voltage (e.g., a write voltage) as illustrated by unselected digit line signaling 635-*a* because a current may be supplied via a respective third transistor 520 and the first transistor 530 may be deactivated, allowing a respective unselected digit line 515 to charge to a higher voltage. However, if the interstitial gate of the first transistor 530 of the unselected digit line 515 stores the second state, the unselected digit line 515 may remain at or transition to a lower voltage (e.g., the voltage of unselected digit line signaling 635 prior to 675-*a*) as illustrated by unselected digit line signaling 635-*b* because the first transistor 530 may sink the current supplied via the third transistor 520 to a respective ground reference, thus preventing the unselected digit line 515 to charge. After the unselected digit line 515 transitions to the higher voltage or the lower voltage, first deck select signaling 630 may transition from the high voltage to the low voltage.

After the first deck select signaling 630 transitions from the low voltage to the high voltage (e.g., and before the first deck select signaling 630 transitions back to the low voltage), second deck select signaling 640 may transition from the low voltage to the high voltage. Additionally, while or after second deck select signaling 640 transitions to the high voltage, if an interstitial gate of the first transistor 530 of an unselected digit line 515 of the second deck (e.g., digit line 515-*b*) stores the first state, that unselected digit line 515 may transition to a higher voltage (e.g., a write voltage) as illustrated by unselected digit line signaling 645-*a* because a current may be supplied via a respective third transistor 520 and the first transistor 530 may be deactivated, allowing a respective unselected digit line 515 to charge to a higher voltage. However, if the interstitial gate of the first transistor 530 of the unselected digit line 515 stores the second state, the unselected digit line 515 may remain at or transition to a lower voltage (e.g., the voltage of unselected digit line signaling 645 prior to 675-*a*) according to unselected digit line signaling 645-*b* because the first transistor 530 may sink the current supplied via the third transistor 520 to a respective ground reference, thus preventing the unselected digit line 515 to charge. After the unselected digit line 515 transitions to the higher voltage or the lower voltage, second deck select signaling 640 may transition from the high voltage to the low voltage.

After the second deck select signaling 640 transitions from the low voltage to the high voltage (e.g., and before the second deck select signaling 640 transitions back to the low voltage), third deck select signaling 650 may transition from the low voltage to the high voltage. Additionally, while or after third deck select signaling 650 transitions to the high voltage, if an interstitial gate of the first transistor 530 of an unselected digit line 515 of the third deck (e.g., digit line 515-*c*) stores the first state, that unselected digit line 515 may transition to a higher voltage (e.g., a write voltage) as illustrated by unselected digit line signaling 655-*a* because a current may be supplied via a respective third transistor 520 and the first transistor 530 may be deactivated, allowing a respective unselected digit line 515 to charge to a higher voltage. However, if the interstitial gate the first transistor 530 of the unselected digit line 515 stores the second state, the unselected digit line 515 may remain at or transition to a lower voltage (e.g., the voltage of unselected digit line signaling 655 prior to 675-*a*) as illustrated by unselected digit line signaling 655-b because the first transistor 530 may sink the current supplied via the third transistor 520 to a respective ground reference, thus preventing the unselected digit line 515 to charge. After the unselected digit line 515 transitions to the higher voltage or the lower voltage, third deck select signaling 650 may transition from the high voltage to the low voltage.

After the third deck select signaling 650 transitions from the low voltage to the high voltage (e.g., and before the third deck select signaling 650 transitions back to the low voltage), fourth deck select signaling 660 may transition from the low voltage to the high voltage. Additionally, while or after fourth deck select signaling 660 transitions to the high voltage, if an interstitial gate of the first transistor 530 of an unselected digit line 515 of the fourth deck (e.g., digit line 515-d) stores the first state, that unselected digit line 515 may transition to a higher voltage (e.g., a write voltage) as illustrated by unselected digit line signaling 665-a because a current may be supplied via a respective third transistor 520 and the first transistor 530 may be deactivated, allowing a respective unselected digit line 515 to charge to a higher voltage. However, if the interstitial gate of the first transistor 530 of the unselected digit line 515 stores the second state, the unselected digit line 515 may remain at or transition to a lower voltage (e.g., the voltage of unselected digit line signaling 665 prior to 675-a) as illustrated by unselected digit line signaling 665-b because the first transistor 530 may sink the current supplied via the third transistor 520 to a respective ground reference, thus preventing the unselected digit line 515 to charge. After the unselected digit line 515 transitions to the higher voltage or the lower voltage, fourth deck select signaling 660 may transition from the high voltage to the low voltage.

After the voltage on the selected and unselected digit lines 515 for each deck (e.g., each of the first deck, second deck, third deck, and fourth deck) transition according to the applied current and the state stored at interstitial gates of respective first transistors 530, pull-up enable signaling 625 may transition from the high voltage to the low voltage. Pull-up enable signaling 625 transitioning to the low voltage may deactivate the one or more of third transistors 520-a, 520-b, and 520-c previously activated by pull-up enable signaling transitioning to the high voltage.

After pull-up enable signaling 625 transitions back to the low voltage, word line signaling 610 may transition back from the low voltage to the high voltage. Transitioning to the high voltage may deactivate the first transistors 530 coupled with word line 510. Additionally, after pull-up enable signaling transitions back to the low voltage, word line signaling 605 may transition from a low voltage to a high voltage. Transitioning from the low voltage to the high voltage may activate (e.g., turn on) each second transistor 525 coupled with word line 505. Activating the second transistors 525 may enable interstitial gates of respective first transistors 530 to be charged by respective digit lines 515. For instance, if an interstitial gate of a first transistor 530 stores the first state, the charge stored at the interstitial gate may be restored according to cell floating node signaling 670-a. However, if the interstitial gate of the first transistor 530 stores the second state, the charge stored at the interstitial gate may be restored according to cell floating node signaling 670-b.

In some examples, pull-up enable signaling 625 may not transition back to the low voltage until after word line signaling 605 transitions from the low voltage to the high voltage and back to the low voltage. In such examples, pull-up enable signaling 625 may transition from the high voltage to the low voltage after word line signaling 605 transitions back to the low voltage. Additionally or alternatively, word line signaling 610 may not transition back to the high voltage until after word line signaling 605 transitions from the low voltage to the high voltage and back to the low voltage. In such examples, word line signaling 610 may transition from the low voltage to the high voltage after word line signaling transitions back to the low voltage. Refraining from transitioning pull-up enable signaling 625 to back to the low voltage and/or refraining from transitioning word line signaling 610 back to the high voltage until after word line signaling 610 transitions back to the low voltage may enable a digit line 515 associated with the signaling to be actively driven while a second transistor 525 coupled with the digit line 515 is activated (e.g., as opposed to enabling digit line 515 to be floating while second transistor 525 is activated).

After the charge has been restored at the interstitial gates of respective first transistors 530, word line signaling 605 may transition from the high voltage to the low voltage. Transitioning from the high voltage to the low voltage may deactivate each of the second transistors 525 coupled with word line 505, thus trapping the charge on the interstitial gates of the first transistors 530 that was transferred or supplied during word line signaling 605 being at the high voltage.

At or after 675-d, if the interstitial gate of the first transistor 530 of the selected digit line 515 stores the first state, selected digit line signaling 620-a may transition to the low voltage (e.g., the voltage of selected digit line signaling 620 prior to or at 675-a). Additionally, at or after 675-d, if the interstitial gates of first transistors 530 of unselected digit lines 515 of the first deck, the second deck, the third deck, or the fourth deck stores the first state, unselected digit line signaling 635-a, 645-a, 655-a, or 665-a, respectively may transition to the low voltage (e.g., the voltage of unselected digit line signaling 635, 645, 655, or 665, respectively prior to or at 675-a).

In some examples, circuit 500 may perform the methods described herein without performing an access operation. For instance, during the time duration between 675-b and 675-c, the circuit 500 may refrain from performing an access operation. Alternatively, 675-b and 675-c may occur at a same time (e.g., the duration between 675-b and 675-c may be equal to 0). In some examples in which an access operation is not performed, a source of SDL signaling 620 may be isolated from each digit line 515 and/or a source of UDL signaling (e.g., unselected digit line signaling 635, 645, 655, 665) may be coupled with each digit line 515 (e.g., there may be no selected digit line 515, each digit line 515 may be an unselected digit line 515). Additionally, in some such examples, a source of third deck select signaling 615 may be isolated from the third deck and/or a source of third deck select signaling 650 may be coupled with the third deck.

Figure 7:
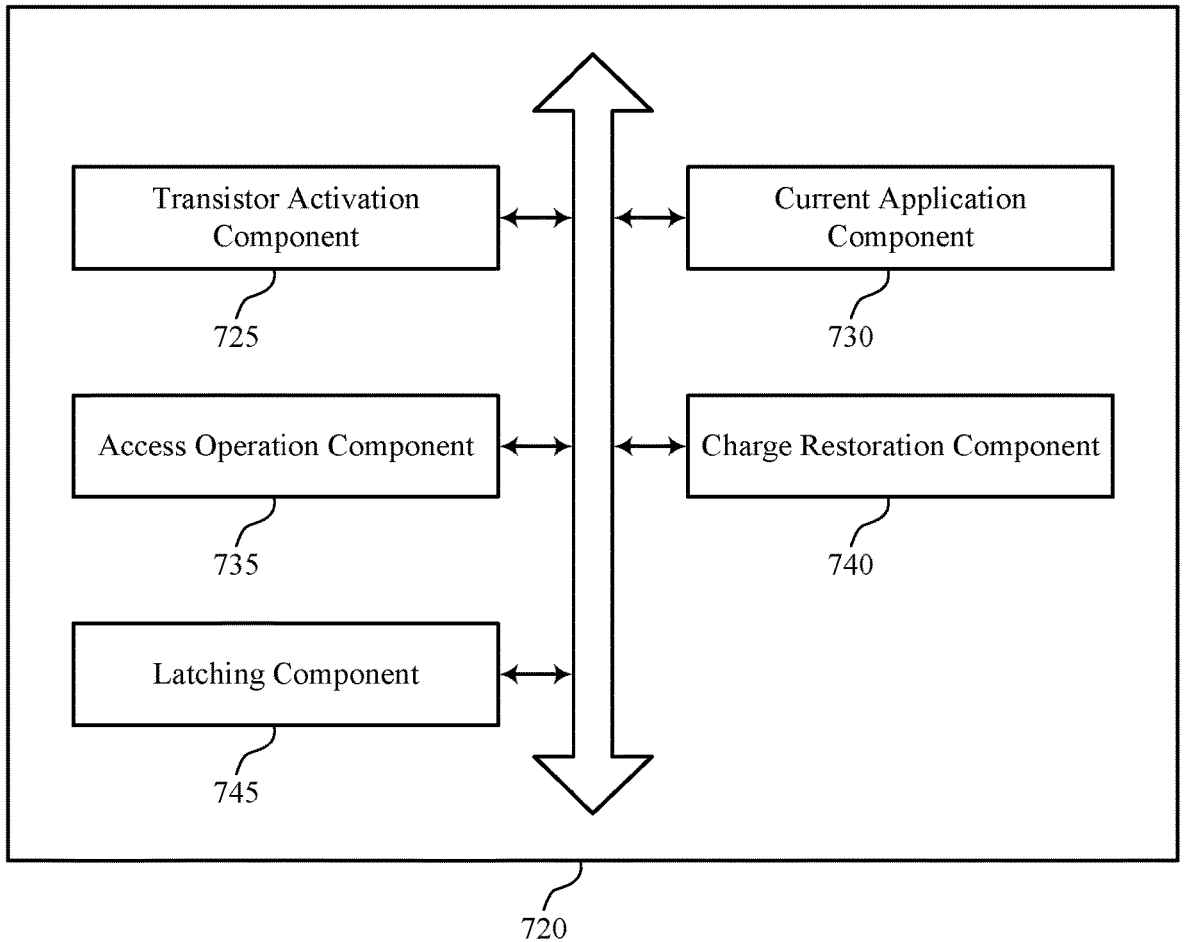
FIG. 7 shows a block diagram of a memory device that supports self-refresh of memory cells in accordance with examples as disclosed herein.

FIG. 7 shows a block diagram 700 of a memory device 720 that supports self-refresh of memory cells in accordance with examples as disclosed herein. The memory device 720 may be an example of aspects of a memory device as described with reference to FIGS. 1 through 6. The memory device 720, or various components thereof, may be an example of means for performing various aspects of self-refresh of memory cells as described herein. For example, the memory device 720 may include a transistor activation component 725, a current application component 730, an access operation component 735, a charge restoration component 740, a latching component 745, or any combination thereof. Each of these components may communicate, directly or indirectly, with one another (e.g., via one or more buses).

The transistor activation component 725 may be configured as or otherwise support a means for applying a first voltage to a control gate of a first transistor of a memory cell, where the first voltage activates the first transistor to selectively couple a first terminal of the first transistor with a second terminal of the first transistor based at least in part on a charge stored at an interstitial gate of the first transistor, and where the first terminal of the first transistor is coupled with a bit line. The current application component 730 may be configured as or otherwise support a means for applying a current to the bit line, where a second voltage of the bit line is based at least in part on applying the current to the bit line and the charge stored on the interstitial gate of the first transistor. In some examples, the transistor activation component 725 may be configured as or otherwise support a means for applying, based at least in part on applying the first voltage to the control gate of the first transistor and applying the current to the bit line, a third voltage to a gate of a second transistor of the memory cell to couple the bit line with the interstitial gate of the first transistor, where a first terminal of the second transistor is coupled with the bit line and a second terminal of the second transistor is coupled with the interstitial gate of the first transistor.

In some examples, the current application component 730 may be configured as or otherwise support a means for ceasing to apply the current to the bit line before applying the third voltage to the gate of the second transistor, where the second voltage of the bit line is based at least in part on ceasing applying the current.

In some examples, the transistor activation component 725 may be configured as or otherwise support a means for applying a fourth voltage to the control gate of the first transistor before applying the third voltage to the gate of the second transistor, where the fourth voltage deactivates the first transistor to isolate the first terminal of the first transistor from the second terminal of the first transistor.

In some examples, the charge restoration component 740 may be configured as or otherwise support a means for restoring the charge at the interstitial gate of the first transistor based at least in part on activating the second transistor.

In some examples, the transistor activation component 725 may be configured as or otherwise support a means for applying a fifth voltage to the gate of the second transistor, where the fifth voltage deactivates the second transistor to isolate the bit line from the interstitial gate of the second transistor, and where the charge at the interstitial gate of the first transistor is restored based at least in part on deactivating the second transistor.

In some examples, the first transistor includes a P-channel metal-oxide semiconductor. In some examples, the second transistor includes an N-channel metal-oxide semiconductor.

In some examples, the second terminal of the first transistor is coupled with a ground of a memory array including the memory cell.

The access operation component 735 may be configured as or otherwise support a means for performing an access operation on a first memory cell of a memory array, where performing the access operation includes activating a first transistor via a first word line coupled with the first transistor of the first memory cell, where the first memory cell is coupled with a first bit line. In some examples, the current application component 730 may be configured as or otherwise support a means for applying a current to a second bit line coupled with a second memory cell based at least in part on performing the access operation on the first memory cell, where a voltage of the second bit line is based at least in part on the current and a charge stored at an interstitial gate of a second transistor of the second memory cell. In some examples, the transistor activation component 725 may be configured as or otherwise support a means for activating a third transistor of the first memory cell and a fourth transistor of the second memory cell via a second word line coupled with the third transistor and the fourth transistor. The charge restoration component 740 may be configured as or otherwise support a means for restoring the charge stored at the interstitial gate of the second transistor based at least in part on activating the fourth transistor.

In some examples, the current application component 730 may be configured as or otherwise support a means for ceasing applying the current to the second bit line before activating the fourth transistor, where the voltage of the second bit line is based at least in part on ceasing applying the current.

In some examples, the transistor activation component 725 may be configured as or otherwise support a means for activating the second transistor before applying the current to the second bit line, where the voltage of the second bit line is based at least in part on activating the second transistor before applying the current.

In some examples, the current application component 730 may be configured as or otherwise support a means for ceasing applying the current to the second bit line. In some examples, the transistor activation component 725 may be configured as or otherwise support a means for deactivating the second transistor after ceasing applying the current to the second bit line, where the charge is restored at the interstitial gate of the second transistor based at least in part on deactivating the second transistor after applying the current to the second bit line.

In some examples, the second transistor is deactivated before the fourth transistor is activated. In some examples, the charge is restored at the interstitial gate of the second transistor based at least in part on deactivating the second transistor before the fourth transistor is activated.

In some examples, the transistor activation component 725 may be configured as or otherwise support a means for deactivating the fourth transistor after activating the fourth transistor, where the charge is restored at the interstitial gate of the second transistor based at least in part on deactivating the fourth transistor after activating the fourth transistor.

In some examples, the current application component 730 may be configured as or otherwise support a means for applying the current to the first bit line based at least in part on performing the access operation on the first memory cell, where a voltage of the first bit line is based at least in part on the current and a charge stored at an interstitial gate of the first transistor. In some examples, the latching component 745 may be configured as or otherwise support a means for latching a representation of the voltage of the first bit line at a sense amplifier, where the first bit line and the second bit line are coupled with the sense amplifier via respective selection components.

In some examples, the first transistor and the second transistor each include a p-type transistor. In some examples, the third transistor and the fourth transistor each include an n-type transistor.

Figure 8:
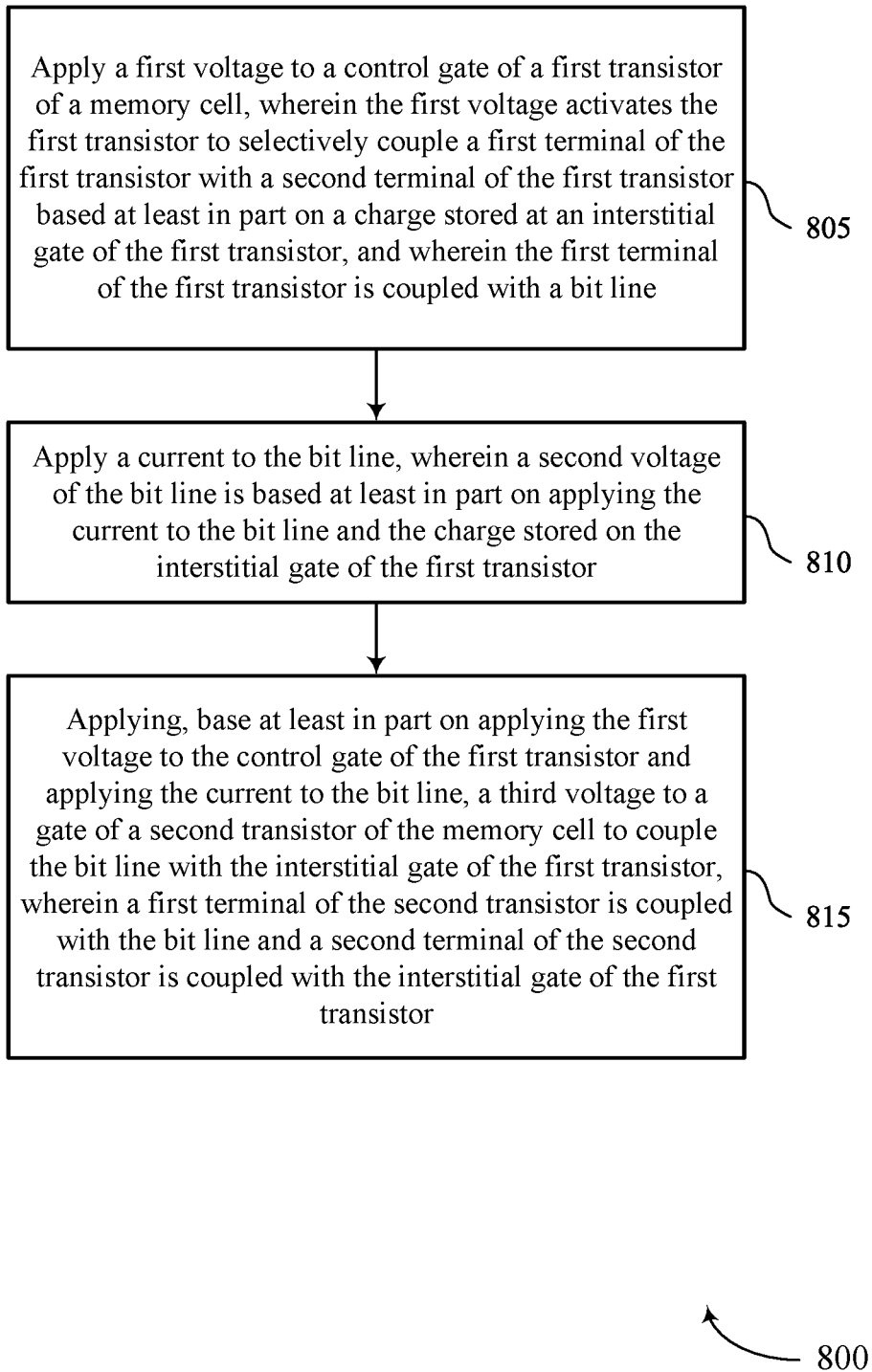
FIGS. 8 and 9 show flowcharts illustrating a method or methods that support self-refresh of memory cells in accordance with examples as disclosed herein.

FIG. 8 shows a flowchart illustrating a method 800 that supports self-refresh of memory cells in accordance with examples as disclosed herein. The operations of method 800 may be implemented by a memory device or its components as described herein. For example, the operations of method 800 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 805, the method may include applying a first voltage to a control gate of a first transistor of a memory cell, where the first voltage activates the first transistor to selectively couple a first terminal of the first transistor with a second terminal of the first transistor based at least in part on a charge stored at an interstitial gate of the first transistor, and where the first terminal of the first transistor is coupled with a bit line. The operations of 805 may be performed in accordance with examples as disclosed herein. In some examples, aspects of the operations of 805 may be performed by a transistor activation component 725 as described with reference to FIG. 7.

At 810, the method may include applying a current to the bit line, where a second voltage of the bit line is based at least in part on applying the current to the bit line and the charge stored on the interstitial gate of the first transistor. The operations of 810 may be performed in accordance with examples as disclosed herein. In some examples, aspects of the operations of 810 may be performed by a current application component 730 as described with reference to FIG. 7.

At 815, the method may include applying, based at least in part on applying the first voltage to the control gate of the first transistor and applying the current to the bit line, a third voltage to a gate of a second transistor of the memory cell to couple the bit line with the interstitial gate of the first transistor, where a first terminal of the second transistor is coupled with the bit line and a second terminal of the second transistor is coupled with the interstitial gate of the first transistor. The operations of 815 may be performed in accordance with examples as disclosed herein. In some examples, aspects of the operations of 815 may be performed by a transistor activation component 725 as described with reference to FIG. 7.

In some examples, an apparatus as described herein may perform a method or methods, such as the method 800. The apparatus may include, features, circuitry, logic, means, or instructions (e.g., a non-transitory computer-readable medium storing instructions executable by a processor) for applying a first voltage to a control gate of a first transistor of a memory cell, where the first voltage activates the first transistor to selectively couple a first terminal of the first transistor with a second terminal of the first transistor based at least in part on a charge stored at an interstitial gate of the first transistor, and where the first terminal of the first transistor is coupled with a bit line, applying a current to the bit line, where a second voltage of the bit line is based at least in part on applying the current to the bit line and the charge stored on the interstitial gate of the first transistor, and applying, based at least in part on applying the first voltage to the control gate of the first transistor and applying the current to the bit line, a third voltage to a gate of a second transistor of the memory cell to couple the bit line with the interstitial gate of the first transistor, where a first terminal of the second transistor is coupled with the bit line and a second terminal of the second transistor is coupled with the interstitial gate of the first transistor.

Some examples of the method 800 and the apparatus described herein may further include operations, features, circuitry, logic, means, or instructions for ceasing to apply the current to the bit line before applying the third voltage to the gate of the second transistor, where the second voltage of the bit line may be based at least in part on ceasing applying the current.

Some examples of the method 800 and the apparatus described herein may further include operations, features, circuitry, logic, means, or instructions for applying a fourth voltage to the control gate of the first transistor before applying the third voltage to the gate of the second transistor, where the fourth voltage deactivates the first transistor to isolate the first terminal of the first transistor from the second terminal of the first transistor.

Some examples of the method 800 and the apparatus described herein may further include operations, features, circuitry, logic, means, or instructions for restoring the charge at the interstitial gate of the first transistor based at least in part on activating the second transistor.

Some examples of the method 800 and the apparatus described herein may further include operations, features, circuitry, logic, means, or instructions for applying a fifth voltage to the gate of the second transistor, where the fifth voltage deactivates the second transistor to isolate the bit line from the interstitial gate of the second transistor, and where the charge at the interstitial gate of the first transistor may be restored based at least in part on deactivating the second transistor.

In some examples of the method 800 and the apparatus described herein, the first transistor includes a P-channel metal-oxide semiconductor, and the second transistor includes an N-channel metal-oxide semiconductor.

In some examples of the method 800 and the apparatus described herein, the second terminal of the first transistor may be coupled with a ground of a memory array including the memory cell.

Figure 9:
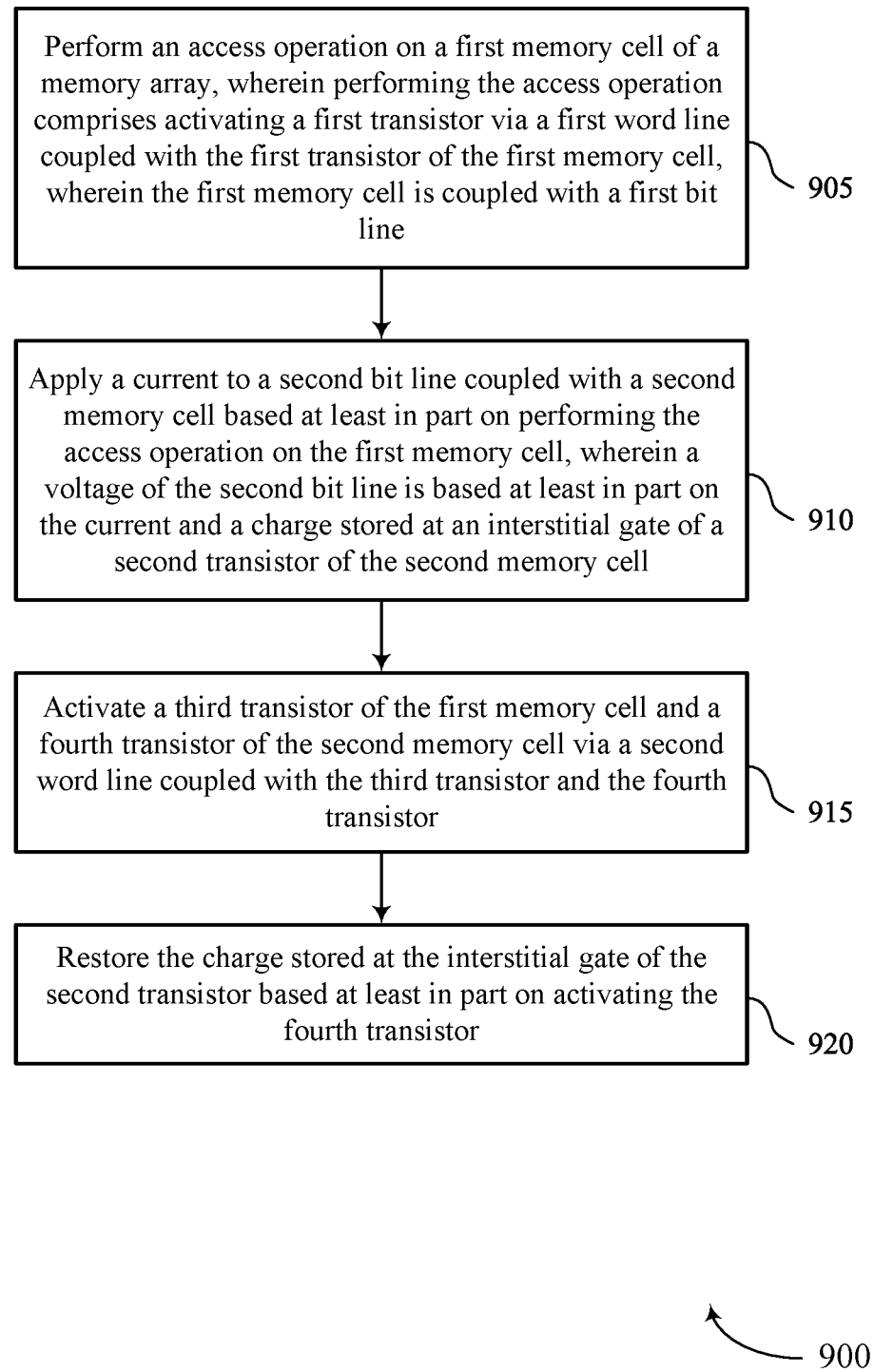

FIG. 9 shows a flowchart illustrating a method 900 that supports self-refresh of memory cells in accordance with examples as disclosed herein. The operations of method 900 may be implemented by a memory device or its components as described herein. For example, the operations of method 900 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 905, the method may include performing an access operation on a first memory cell of a memory array, where performing the access operation includes activating a first transistor via a first word line coupled with the first transistor of the first memory cell, where the first memory cell is coupled with a first bit line. The operations of 905 may be performed in accordance with examples as disclosed herein. In some examples, aspects of the operations of 905 may be performed by an access operation component 735 as described with reference to FIG. 7.

At 910, the method may include applying a current to a second bit line coupled with a second memory cell based at least in part on performing the access operation on the first memory cell, where a voltage of the second bit line is based at least in part on the current and a charge stored at an interstitial gate of a second transistor of the second memory cell. The operations of 910 may be performed in accordance with examples as disclosed herein. In some examples, aspects of the operations of 910 may be performed by a current application component 730 as described with reference to FIG. 7.

At 915, the method may include activating a third transistor of the first memory cell and a fourth transistor of the second memory cell via a second word line coupled with the third transistor and the fourth transistor. The operations of 915 may be performed in accordance with examples as disclosed herein. In some examples, aspects of the operations of 915 may be performed by a transistor activation component 725 as described with reference to FIG. 7.

At 920, the method may include restoring the charge stored at the interstitial gate of the second transistor based at least in part on activating the fourth transistor. The operations of 920 may be performed in accordance with examples as disclosed herein. In some examples, aspects of the operations of 920 may be performed by a charge restoration component 740 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor) for performing an access operation on a first memory cell of a memory array, where performing the access operation includes activating a first transistor via a first word line coupled with the first transistor of the first memory cell, where the first memory cell is coupled with a first bit line, applying a current to a second bit line coupled with a second memory cell based at least in part on performing the access operation on the first memory cell, where a voltage of the second bit line is based at least in part on the current and a charge stored at an interstitial gate of a second transistor of the second memory cell, activating a third transistor of the first memory cell and a fourth transistor of the second memory cell via a second word line coupled with the third transistor and the fourth transistor, and restoring the charge stored at the interstitial gate of the second transistor based at least in part on activating the fourth transistor.

Some examples of the method 900 and the apparatus described herein may further include operations, features, circuitry, logic, means, or instructions for ceasing applying the current to the second bit line before activating the fourth transistor, where the voltage of the second bit line may be based at least in part on ceasing applying the current.

Some examples of the method 900 and the apparatus described herein may further include operations, features, circuitry, logic, means, or instructions for activating the second transistor before applying the current to the second bit line, where the voltage of the second bit line may be based at least in part on activating the second transistor before applying the current.

Some examples of the method 900 and the apparatus described herein may further include operations, features, circuitry, logic, means, or instructions for ceasing applying the current to the second bit line and deactivating the second transistor after ceasing applying the current to the second bit line, where the charge may be restored at the interstitial gate of the second transistor based at least in part on deactivating the second transistor after applying the current to the second bit line.

In some examples of the method 900 and the apparatus described herein, the second transistor may be deactivated before the fourth transistor may be activated, and the charge may be restored at the interstitial gate of the second transistor based at least in part on deactivating the second transistor before the fourth transistor may be activated.

Some examples of the method 900 and the apparatus described herein may further include operations, features, circuitry, logic, means, or instructions for deactivating the fourth transistor after activating the fourth transistor, where the charge may be restored at the interstitial gate of the second transistor based at least in part on deactivating the fourth transistor after activating the fourth transistor.

Some examples of the method 900 and the apparatus described herein may further include operations, features, circuitry, logic, means, or instructions for applying the current to the first bit line based at least in part on performing the access operation on the first memory cell, where a voltage of the first bit line may be based at least in part on the current and a charge stored at an interstitial gate of the first transistor and latching a representation of the voltage of the first bit line at a sense amplifier, where the first bit line and the second bit line may be coupled with the sense amplifier via respective selection components.

In some examples of the method 900 and the apparatus described herein, the first transistor and the second transistor each include a p-type transistor, and the third transistor and the fourth transistor each include an n-type transistor.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory cell including a first transistor including a control gate and an interstitial gate, where a first terminal of the first transistor is coupled with a bit line, a second transistor, where a first terminal of the second transistor is coupled with the bit line and a second terminal of the second transistor is coupled with the interstitial gate of the first transistor, and a controller coupled with the memory cell. The controller may be configured to apply a first voltage to the control gate of the first transistor, where the first voltage activates the first transistor to selectively couple the first terminal of the first transistor with a second terminal of the first transistor based at least in part on a charge stored on the interstitial gate, apply a current to the bit line, where a second voltage of the bit line is based at least in part on applying the current to the bit line and the charge stored on the interstitial gate of the first transistor, and apply, based at least in part on applying the first voltage to the control gate of the first transistor and applying the current to the bit line, a third voltage to a gate of the second transistor to couple the bit line with the interstitial gate of the first transistor.

In some examples, the controller may be further configured to cease applying the current to the bit line before applying the third voltage to the gate of the second transistor, where the second voltage of the bit line may be based at least in part on ceasing applying the current.

In some examples, the controller may be further configured to apply a fourth voltage to the control gate of the first transistor before applying the third voltage to the gate of the second transistor, where the fourth voltage deactivates the first transistor to isolate the first terminal of the first transistor from the second terminal of the first transistor.

In some examples of the apparatus, the charge at the interstitial gate of the first transistor may be restored based at least in part on activating the second transistor.

In some examples, the controller may be further configured to apply a fifth voltage to the gate of the second transistor, where the fifth voltage deactivates the second transistor to isolate the bit line from the interstitial gate of the second transistor, and where the charge at the interstitial gate of the first transistor may be restored based at least in part on deactivating the second transistor.

In some examples of the apparatus, the first transistor includes a P-channel metal-oxide semiconductor, and the second transistor includes an N-channel metal-oxide semiconductor.

In some examples of the apparatus, the second terminal of the first transistor may be coupled with a ground of the memory device.

Another apparatus is described. The apparatus may include a memory array including a first word line coupled with a first transistor of a first memory cell and a second transistor of a second memory cell, a second word line coupled with a third transistor of the first memory cell and a fourth transistor of the second memory cell, a first bit line coupled with the first memory cell, a second bit line coupled with the second memory cell, and a controller coupled with the memory array. The controller is configured to perform an access operation on the first memory cell, where performing the access operation includes activating the first transistor via the first word line, apply a current to the second bit line based at least in part on performing the access operation on the first memory cell, where a voltage of the second bit line is based at least in part on the current and a charge stored at an interstitial gate of the second transistor, and activate the third transistor and the fourth transistor via the second word line, where activating the fourth transistor restores the charge stored at the interstitial gate of the second transistor.

In some examples, the controller may be further configured to cease applying the current to the second bit line before activating the fourth transistor, where the voltage of the second bit line may be based at least in part on ceasing applying the current.

In some examples, the controller may be further configured to activate the second transistor before applying the current to the second bit line, where the voltage of the second bit line may be based at least in part on activating the second transistor before applying the current.

In some examples, the controller may be further configured to cease applying the current to the second bit line and deactivate the second transistor after ceasing applying the current to the second bit line, where the charge may be restored at the interstitial gate of the second transistor based at least in part on deactivating the second transistor after applying the current to the second bit line.

In some examples of the apparatus, the second transistor may be deactivated before the fourth transistor may be activated, and the charge may be restored at the interstitial gate of the second transistor based at least in part on deactivating the second transistor before the fourth transistor may be activated.

In some examples, the controller may be further configured to deactivate the fourth transistor after activating the fourth transistor, where the charge may be restored at the interstitial gate of the second transistor based at least in part on deactivating the fourth transistor after activating the fourth transistor.

In some examples, the controller may be further configured to apply the current to the first bit line based at least in part on performing the access operation on the first memory cell, where a voltage of the first bit line may be based at least in part on the current and a charge stored at an interstitial gate of the first transistor and latch a representation of the voltage of the first bit line at a sense amplifier, where the first bit line and the second bit line may be coupled with the sense amplifier via respective selection components.

In some examples, the apparatus may include a set of bit lines including the first bit line and the second bit line and a set of sense amplifiers, where each bit line of the set of bit lines may be coupled with a sense amplifier of the set of sense amplifiers via a respective switching component, and where a total quantity of bit lines in the set of bit lines may be greater than a total quantity of sense amplifiers in the set of sense amplifiers.

In some examples of the apparatus, the first transistor and the second transistor each include a p-type transistor, and the third transistor and the fourth transistor each include an n-type transistor.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a memory array comprising a word line coupled with a first set of memory cells and a second set of memory cells, wherein the memory array further comprises a first set of bit lines coupled with the first set of memory cells and a second set of bit lines coupled with the second set of memory cells;
   a set of sense amplifiers; and
   a controller coupled with the memory array and configured to:
   receive, from a host device, a command indicating to perform an access operation on the first set of memory cells coupled with the word line;
   isolate the second set of memory cells coupled with the word line from the set of sense amplifiers based at least in part on receiving the command; and
   apply a current to the second set of bit lines when the second set of memory cells are isolated from the set of sense amplifiers, wherein the second set of memory cells are configured to restore respective charge states stored at the second set of memory cells based at least in part on the current being applied to the second set of bit lines.

2. The apparatus of claim 1, wherein the controller is further configured to:
   couple the first set of memory cells with the set of sense amplifiers based at least in part on receiving the command, wherein the second set of memory cells are isolated from the set of sense amplifiers based at least in part on the coupling.

3. The apparatus of claim 2, wherein a quantity of the set of sense amplifiers is equal to a quantity of the first set of memory cells.

4. The apparatus of claim 1, wherein each memory cell of the second set of memory cells comprises a first transistor and a second transistor, wherein a voltage of each bit line of the second set of bit lines is based at least in part on the current and a charge stored at an interstitial gate of the first transistor of a respective memory cell coupled with the bit line, and wherein the controller being configured to restore the respective charge states at the second set of memory cells comprises the controller being configured to:
   activate, for each bit line of the second set of bit lines, the second transistor of the respective memory cell coupled with the bit line, wherein activating the second transistor restores the charge stored at the interstitial gate of the first transistor of the respective memory cell.

5. The apparatus of claim 4, wherein the controller being configured to restore the respective charge states at the second set of memory cells further comprises the controller being configured to:
   cease applying the current to each bit line of the second set of bit lines before activating the second transistor of the respective memory cell coupled with the bit line.

6. The apparatus of claim 4, wherein the controller being configured to restore the respective charge states at the second set of memory cells further comprises the controller being configured to:
   activate, for each bit line of the second set of bit lines, the first transistor of the respective memory cell coupled with the bit line before applying the current to a respective bit line of the second set of bit lines.

7. The apparatus of claim 4, wherein the first transistor for each memory cell of the second set of memory cells comprises a P-channel metal-oxide semiconductor, and the second transistor for each memory cell of the second set of memory cells comprises an N-channel metal-oxide semiconductor.

8. A method, comprising:
   receiving, from a host device, a command indicating to perform an access operation on a first set of memory cells coupled with a word line of a memory array;
   isolating a second set of memory cells coupled with the word line from a set of sense amplifiers based at least in part on receiving the command, wherein a first set of bit lines of the memory array are coupled with the first set of memory cells and a second set of bit lines of the memory array are coupled with the second set of memory cells; and
   applying a current to the second set of bit lines when the second set of memory cells are isolated from the set of sense amplifiers, wherein the second set of memory cells are configured to restore respective charge states stored at the second set of memory cells when the current is applied to the second set of bit lines.

9. The method of claim 8, further comprising:
   coupling the first set of memory cells with the set of sense amplifiers based at least in part on receiving the command, wherein the second set of memory cells are isolated from the set of sense amplifiers based at least in part on the coupling.

10. The method of claim 9, wherein a quantity of the set of sense amplifiers is equal to a quantity of the first set of memory cells.

11. The method of claim 10, wherein each memory cell of the second set of memory cells comprises a first transistor and a second transistor, wherein a voltage of each bit line of the second set of bit lines is based at least in part on the current and a charge stored at an interstitial gate of the first transistor of a respective memory cell coupled with the bit line, and wherein restoring the respective charge states at the second set of memory cells comprises:
   activating, for each bit line of the second set of bit lines, the second transistor of the respective memory cell coupled with the bit line, wherein activating the second transistor restores the charge stored at the interstitial gate of the first transistor of the respective memory cell.

12. The method of claim 11, wherein restoring the respective charge states at the second set of memory cells further comprises:

ceasing applying the current to each bit line of the second set of bit lines before activating the second transistor of the respective memory cell of the bit line.

13. The method of claim 11, wherein restoring the respective charge states at the second set of memory cells further comprises:

activating the first transistor of the respective memory cell coupled with each bit line before applying the current to a respective bit line of the second set of bit lines.

14. The method of claim 11, wherein the first transistor for each memory cell of the second set of memory cells comprises a P-channel metal-oxide semiconductor, and the second transistor for each memory cell of the second set of memory cells comprises an N-channel metal-oxide semiconductor.

15. An apparatus, comprising:
a sense amplifier;
a plurality of digit lines;
a plurality of switching components coupled with the sense amplifier and the plurality of digit lines, the plurality of switching components configured to selectively couple the plurality of digit lines with the sense amplifier;
a plurality of current sources coupled with the plurality of digit lines, each of the plurality of current sources coupled with one of a plurality of reference voltages;
a plurality of memory cells coupled with the plurality of digit lines; and
one or more word lines coupled with the plurality of memory cells,
wherein the plurality of current sources are configured to precharge at least a subset of the plurality of digit lines, and wherein the plurality of memory cells are configured to selectively discharge the plurality of digit lines based on respective charge states of the plurality of memory cells, and wherein the plurality of memory cells are configured to restore the respective charge states based at least in part on respective currents supplied by the plurality of current sources.

16. The apparatus of claim 15, wherein each memory cell of the plurality of memory cells comprises:
a respective first transistor coupled with a respective first word line of the one or more word lines and a respective second transistor coupled with a respective second word line of the one or more word lines.

17. The apparatus of claim 16, wherein an interstitial gate of the respective first transistor for each memory cell of the plurality of memory cells is coupled with a source or drain of the respective second transistor.

18. The apparatus of claim 17, wherein a control gate of the respective first transistor is coupled with the respective first word line.

19. The apparatus of claim 16, wherein a first source or a first drain of the respective first transistor and a second source or a second drain of the respective second transistor for each memory cell of the plurality of memory cells is coupled with a terminal of a respective switching component of the plurality of switching components.

20. The apparatus of claim 16, wherein the plurality of memory cells are configured to restore the respective charge states of the plurality of memory cells based at least in part on respective amounts of charge stored at the plurality of memory cells when the respective currents are supplied by the plurality of current sources.

* * * * *